US012707992B2

(12) United States Patent
Sung et al.

(10) Patent No.: US 12,707,992 B2
(45) Date of Patent: Aug. 11, 2026

(54) ELECTRONIC DEVICE INCLUDING VERTICAL HIGH CURRENT HALL SENSOR WITH INTEGRATED HEAT SLUG CURRENT LOOP POWER PAD

(71) Applicant: Texas Instruments Incorporated, Dallas, TX (US)

(72) Inventors: Hank Sung, Allen, TX (US); Dok Won Lee, Mountain View, CA (US); Wai Lee, Dallas, TX (US); Sreenivasan Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 801 days.

(21) Appl. No.: 17/945,835

(22) Filed: Sep. 15, 2022

(65) Prior Publication Data

US 2024/0096767 A1 Mar. 21, 2024

(51) Int. Cl.

*H10W 70/40* (2026.01)
*G01R 15/20* (2006.01)
*H10W 70/04* (2026.01)
*H10W 72/00* (2026.01)
*H10W 72/30* (2026.01)

(Continued)

(52) U.S. Cl.

CPC ....... *H10W 70/461* (2026.01); *H10W 70/041* (2026.01); *H10W 70/417* (2026.01); *H10W 70/429* (2026.01); *G01R 15/202* (2013.01); *H10W 72/073* (2026.01); *H10W 72/07338* (2026.01); *H10W 72/075* (2026.01); *H10W 72/354* (2026.01); *H10W 72/5449* (2026.01); *H10W 72/884* (2026.01);

(Continued)

(58) Field of Classification Search

CPC ........... H01L 23/49568; H01L 23/3107; H01L 23/3121; H01L 24/49; H01L 2224/49171; G01R 15/202; H10W 70/041; H10W 70/461; H10W 90/736; H10W 90/755; H10W 40/778; H10W 74/111

See application file for complete search history.

(56) References Cited

U.S. PATENT DOCUMENTS 7,342,440 B2 * 3/2008 Bodano ..................... G05F 3/30
257/E23.044
7,358,724 B2 4/2008 Taylor (Continued)

OTHER PUBLICATIONS

Allegro Microsystems. High Accuracy, Galvanically Isolated Current Sensor IC with Small Footprint SOIC8 Package. ACS722-DS, Rev. 5. Sep. 3, 2019, pp. 1-23.

(Continued)

*Primary Examiner* — Khiem D Nguyen
(74) *Attorney, Agent, or Firm* — Ronald O. Neerings; Frank D. Cimino

(57) ABSTRACT

An electronic device includes a metal heat slug, a semiconductor die, and a package structure. The metal heat slug has a first portion, a second portion, and a third portion, the second portion is spaced apart from the first portion, and the third portion connects the first and second portions. The semiconductor die is attached to the third portion of the metal heat slug to measure a current of the third portion of the metal heat slug, and the package structure encloses the semiconductor die and the third portion of the metal heat slug and exposes sides of the first and second portions of the metal heat slug.

26 Claims, 21 Drawing Sheets

(51) Int. Cl.
*H10W 72/50* (2026.01)
*H10W 74/10* (2026.01)
*H10W 90/00* (2026.01)

(52) U.S. Cl.
CPC ........ *H10W 74/114* (2026.01); *H10W 90/736* (2026.01); *H10W 90/755* (2026.01)

(56) References Cited

U.S. PATENT DOCUMENTS

| | | | | |
|---|---|---|---|---|
| 11,990,392 | B2 * | 5/2024 | Hayashi | H01L 23/49568 |
| 2006/0255797 | A1 * | 11/2006 | Taylor | G01R 15/207<br>324/262 |
| 2010/0072992 | A1 | 3/2010 | Bauer | |
| 2010/0188078 | A1 | 7/2010 | Foletto | |
| 2013/0015839 | A1 | 1/2013 | Franke | |
| 2015/0137842 | A1 * | 5/2015 | Murakami | G01R 1/06777<br>324/756.01 |
| 2016/0282388 | A1 | 9/2016 | Milano | |
| 2017/0184636 | A1 * | 6/2017 | Racz | G01R 15/20 |
| 2020/0041310 | A1 | 2/2020 | Lassalle-balier | |
| 2021/0175326 | A1 * | 6/2021 | Romig | H01L 21/565 |
| 2024/0044946 | A1 * | 2/2024 | Briano | G01R 33/0047 |

OTHER PUBLICATIONS

Melexis. “MLX91208 IMC-Hall® Current Sensor (Triaxis® Technology).” Jun. 2018, pp. 1-20.

* cited by examiner

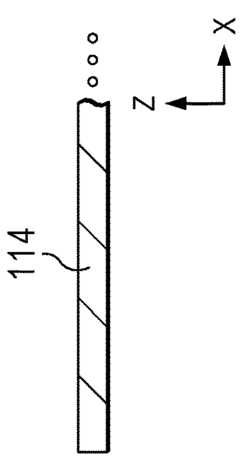
FIG. 3A
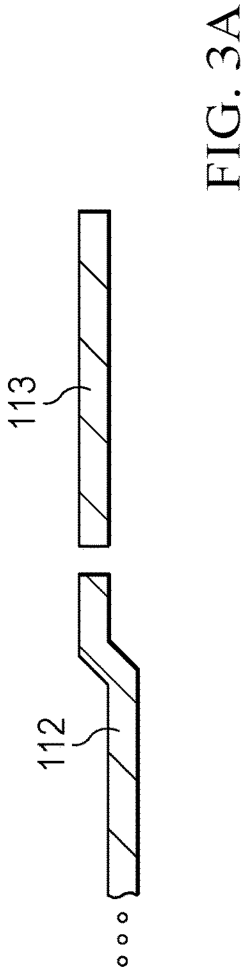

ELECTRONIC DEVICE INCLUDING VERTICAL HIGH CURRENT HALL SENSOR WITH INTEGRATED HEAT SLUG CURRENT LOOP POWER PAD

BACKGROUND

Current sensors are beneficial for a variety of applications. High voltage applications such as motor drives and power systems present packaging and performance challenges for current sensing, and typically require bulky packages and/or non-standard package footprints to accommodate high sensed current levels.

SUMMARY

In one aspect, an electronic device includes a metal heat slug, a semiconductor die, and a package structure. The metal heat slug has a first portion, a second portion, and a third portion, the second portion is spaced apart from the first portion, and the third portion connects the first and second portions. The semiconductor die is attached to the third portion of the metal heat slug to measure a current of the third portion of the metal heat slug, and the package structure encloses the semiconductor die and the third portion of the metal heat slug and exposes sides of the first and second portions of the metal heat slug.

In another aspect, a system includes a circuit board, and an electronic device. The electronic device includes a metal heat slug, a semiconductor die, and a package structure. The metal heat slug has first, second, and third portions, the first portion of the metal heat slug soldered to a first conductive feature of the circuit board, the second portion of the metal heat slug spaced apart from the first portion of the metal heat slug and soldered to a second conductive feature of the circuit board, and the third portion of the metal heat slug connecting the first and second portions of the metal heat slug. The semiconductor die is attached to the third portion of the metal heat slug and configured to measure a current of the third portion of the metal heat slug, and the package structure encloses the semiconductor die and the third portion of the metal heat slug and exposes sides of the first and second portions of the metal heat slug.

In a further aspect, a method of fabricating an electronic device includes attaching first and second portions of a metal heat slug to respective first and second lead frames, attaching a semiconductor die to a third portion of the metal heat slug, electrically connecting a conductive feature of the semiconductor die to a conductive lead, and forming a package structure that encloses the semiconductor die and the third portion of the metal heat slug and exposes sides of the first and second portions of the metal heat slug.

BRIEF DESCRIPTION OF THE DRAWINGS

FIG. 3A is a partial sectional side elevation view taken along line 3A-3A of FIG. 3.

DETAILED DESCRIPTION

Figure 1:
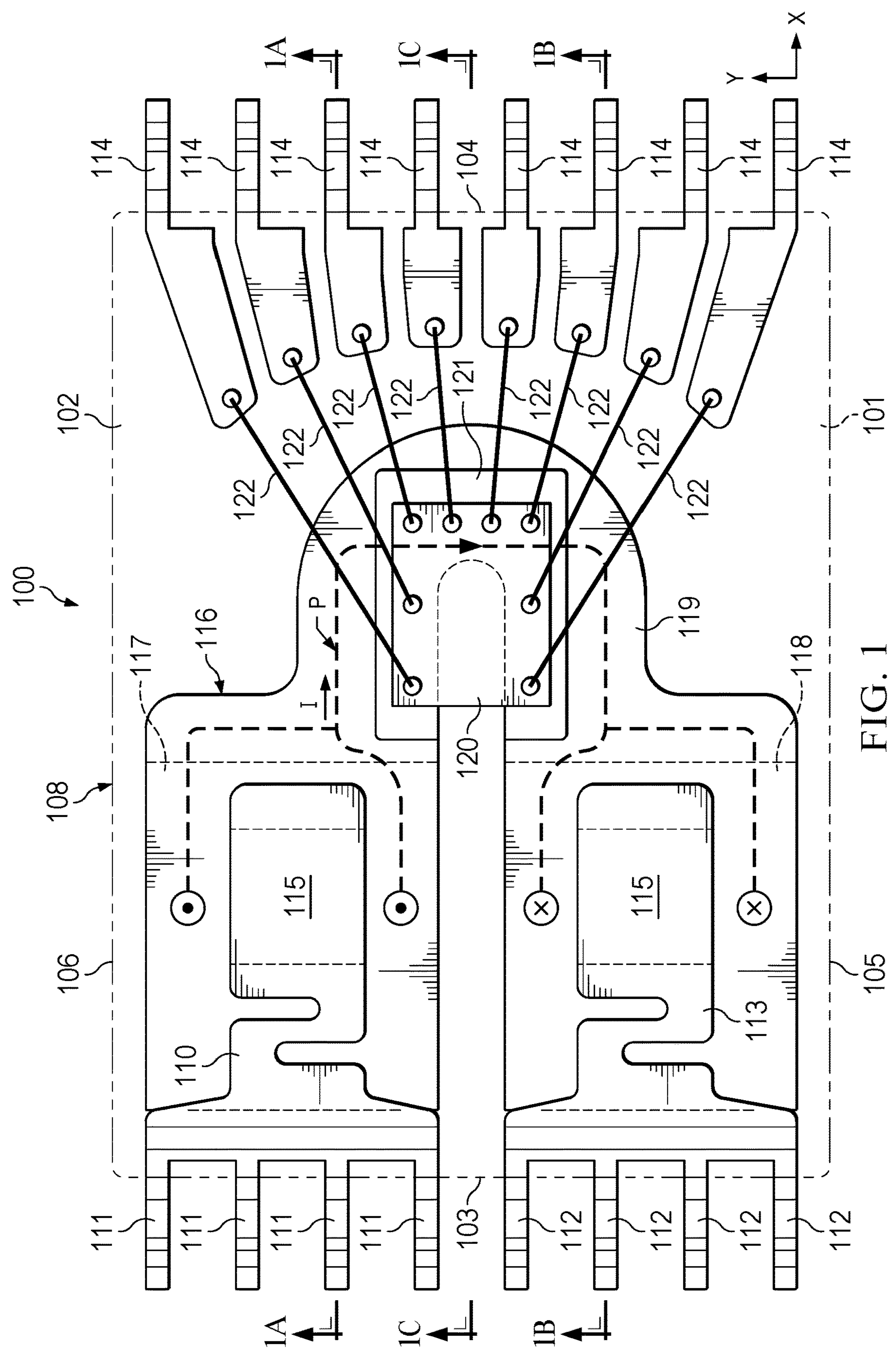
FIG. 1 is a top plan view of a current sensor electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. Unless otherwise stated, "about," "approximately," or "substantially" preceding a value means+/−10 percent of the stated value. One or more operational characteristics of various circuits, systems and/or components are hereinafter described in the context of functions which in some cases result from configuration and/or interconnection of various structures when circuitry is powered and operating.

Figure 1A:
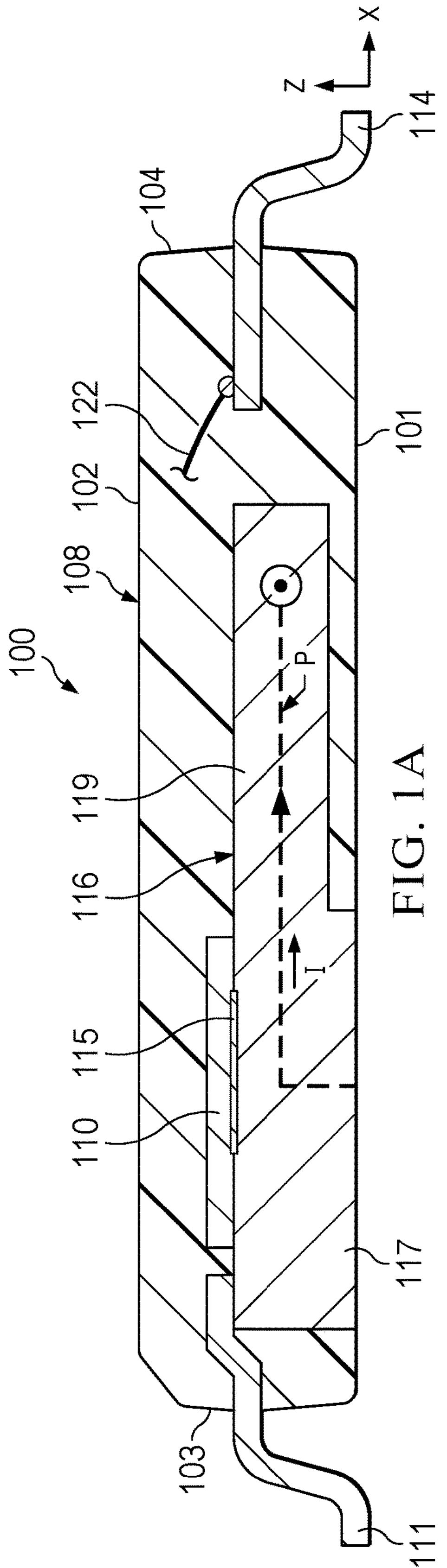
FIG. 1A is a partial sectional side elevation view taken along line 1A-1A of FIG. 1.
Figure 1B:
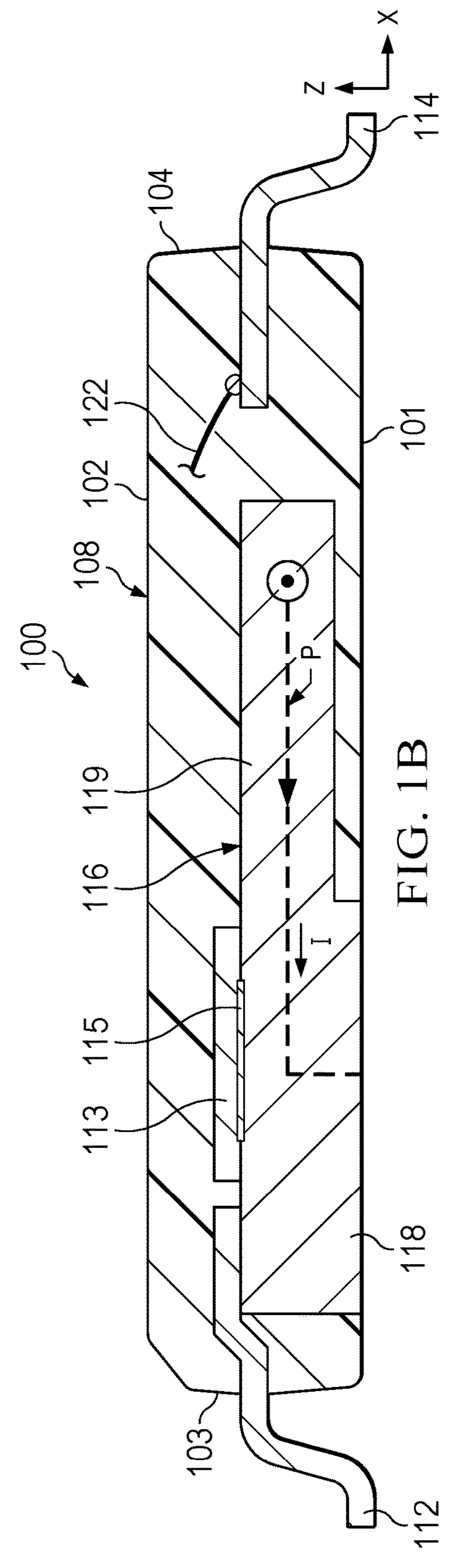
FIG. 1B is a partial sectional side elevation view taken along line 1B-1B of FIG. 1.
Figure 1C:
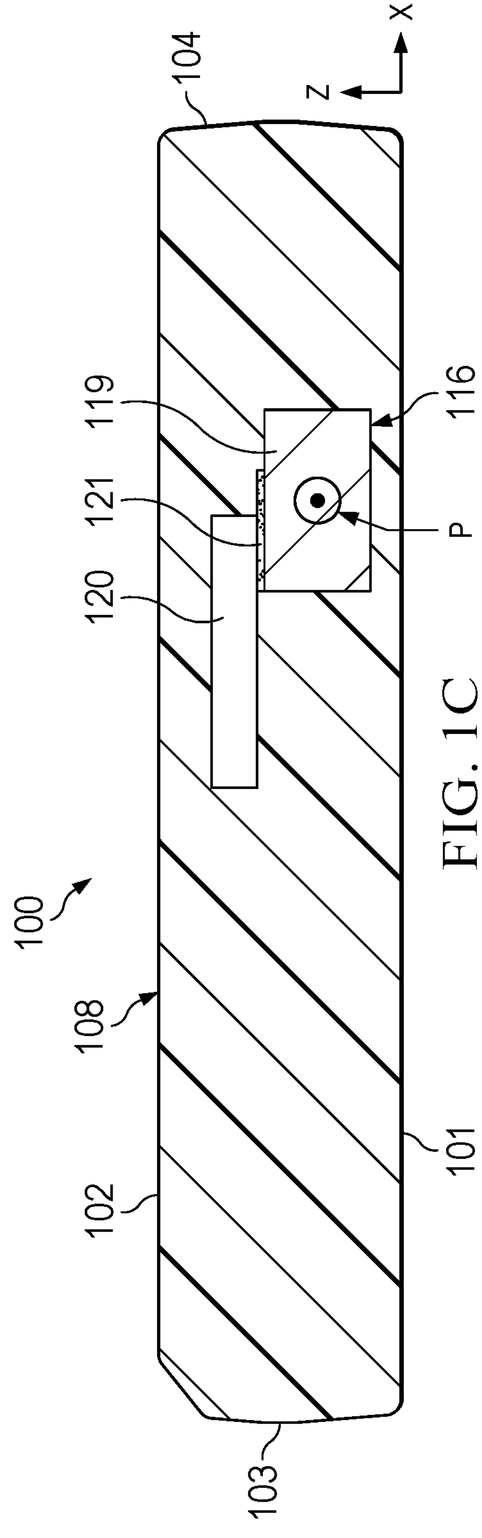
FIG. 1C is a partial sectional side elevation view taken along line 1C-1C of FIG. 1.

FIGS. 1-1C show an electronic device 100 with Hall-effect current sensing circuitry packaged in a small form factor standard package configuration and the capability to sense high levels of current to facilitate current sensing in a variety of applications. FIG. 1 shows a top view of the electronic device 100, FIG. 1A shows a sectional side view taken along line 1A-1A of FIG. 1, FIG. 1B shows a sectional side view taken along line 1B-1B of FIG. 1, and FIG. 1C shows a sectional side view taken along line 1C-1C of FIG. 1. The electronic device 100 is shown in FIGS. 1-1C in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. The electronic device 100 has a package structure 108, such as a molded plastic, and the electronic device has opposite first and second (e.g., bottom and top) sides 101 and 102, respectively, which are spaced apart from one another along the third direction Z. The package structure 108 and the electronic device 100 have laterally opposite third and fourth sides 103 and 104 spaced apart from one another along the first direction X, and opposite fifth and sixth sides 105 and 106 spaced apart from one another along the second direction Y in the illustrated orientation. The sides 101-106 in one example have substantially planar outer surfaces. In other examples, one or more of the sides 101-106 have curves, angled features, or other non-planar surface features.

The electronic device 100 has a first metal lead frame 110 enclosed by the package structure 108, as well as a first set of first leads 111 (FIGS. 1 and 1A) that are connected to the lead frame 110. The first leads 111 are exposed by the package structure 108 and extend outward from the third side 103 of the electronic device 100 at least partially along the first direction X. A second set of first leads 112 (FIGS. 1 and 1B) extend outward from the third side 103 and are connected to a second metal lead frame 113 that is enclosed by the package structure 108. The electronic device 100 includes a set of second leads 114 (FIGS. 1, 1A and 1B) that are partially exposed by the package structure 108. The second leads 114 extend outward from the fourth side 104 of the electronic device 100 at least partially along the first direction X. In the illustrated implementation, one or more of the second leads 114 provide electrical interconnection between circuitry of the electronic device 100 and a host circuit board (e.g., FIG. 10 below), and the first leads 111, 112 can be soldered to a host circuit board, but need not be electrically connected to circuits of the host circuit board. In another implementation, the first leads 111, 112 can be trimmed, such as along the third side 103 of the package structure 108 to prevent soldering to a host circuit board. In one example, the lead frames 110 and 113 and the leads 111, 112 and 114 are or include a conductive metal, such as aluminum, copper, etc.

As seen in FIGS. 1, 1A and 1B, the electronic device 100 includes a metal heat slug 116 with a contiguous electrically conductive metal structure having a first portion 117, a second portion 118, and a third portion 119. Although referred to herein as a heat slug, the slug 116 provides a conduction path for sensing current and need not perform significant thermal heat transfer during operation of the electronic device 100. The metal heat slug 116 is attached to the lead frames 110 and 113, for example, by ultrasonic weld joints 115 in FIGS. 1, 1A, and 1B. The metal heat slug 116 provides a conduction path P for conducting a current I that flows into the first portion 117, through the third portion 119, and out of the second portion 118. The electronic device 100 also includes a semiconductor die 120 (FIGS. 1 and 1C) that is attached to the third portion 119 of the metal heat slug 116 by an adhesive 121. In one example, the adhesive 121 is an insulator (e.g., electrically non-conductive) to facilitate operation where the lead frame operates at a high voltage. In one example, the adhesive 121 is or includes sandwiched or stacked layers of a polymer such as polyimide and non-conductive die attach adhesive, for example, to provide the desired voltage isolation between the die and the lead frame. The semiconductor die 120 has a current sensing circuit that is configured to measure the current I of the third portion 119 of the metal heat slug 116. In one example, the semiconductor die 120 includes a Hall-effect sensor circuit that has a sensing direction generally parallel to the second direction Y to sense a magnetic field generated by the current I. In this or another example, the semiconductor die 120 includes a Hall-effect sensor circuit that has a sensing direction generally parallel to the first direction X to sense the magnetic field generated by the current I. In these or another example, the semiconductor die 120 includes a Hall-effect sensor circuit that has a sensing direction generally parallel to the third direction Z to sense the magnetic field generated by the current I.

One or more of the second leads 114 are electrically coupled to respective conductive features (e.g., copper or other metal bond pads) of the semiconductor die 120 by bond wires 122 as best shown in FIG. 1. In one example, the leads 114 and the bond wires 122 provide power and signal connections between the Hall-effect current sense circuit of the semiconductor die 120 and an external circuit of a host circuit board (not shown) to which the electronic device 100 can be attached. The electronic device 100 provides a small form factor package with standard lead configuration and spacing to facilitate adaptation for installing on a host circuit board, as further illustrated and described below in connection with FIG. 10. The illustrated example includes gullwing leads 111, 112, and 114. In another example, leads can have different forms and shapes, such as J-type leads, etc. In a further example, the semiconductor die 120 is flip chip attached to a lead frame or multilayer package substrate with conductive features (e.g., copper or other metal pillars) of the semiconductor die 120 soldered to conductive features of the lead frame or multilayer package substrate, and the lead frame or other multilayer package substrate includes one or more of the leads 111, 112, and 114 and/or bond wires electrically connect traces of the lead frame or multilayer package substrate to respective ones of the conductive leads 114.

The metal heat slug 116 in one example conducts the current I from the first portion 117 to the third portion 119, and the second portion 118 conducts the current I from the third portion 119 to a connected host circuit (not shown). In this example, the metal heat slug 116 has an inverted U-shape when viewed from the third side 103, in which the second portion 118 is spaced apart from the first portion 117 along the second direction Y, the third portion 119 of the heat slug 116 is spaced apart from the first side (e.g., bottom) of the electronic device 100 as shown in FIGS. 1A-1C, and the third portion 119 connects the first and second portions 117, 118.

The package structure 108 encloses the semiconductor die 120 and the third portion 119 of the metal heat slug 116 and exposes the bottom sides of the first and second portions 117, 118 of the metal heat slug 116. This allows the bottom sides of the first and second portions 117 and 118 to be soldered or otherwise electrically connected to respective conductive pads of a host circuit board for conduction of the current I to be sensed by the semiconductor die 120 in operation of a host system, such as a power system, a motor drive, etc. In one example, the electronic device 100 is configured to operate with the first leads 111, 112 disconnected (e.g., not conducting the sensed current I). In this example, the lead frames 110 and 113 and the first leads 111, 112 operate as an attachment structure for attaching and supporting the heat slug 116 during fabrication, such as by ultrasonic welding, riveting, non-conductive adhesives, or other suitable attachment technique, and the lead frames 110 and 113 and the first leads 111, 112 need not conduct current during powered operation of the electronic device 100.

The example heat slug 116 also has a U-shape viewed from above (e.g., as shown in FIG. 1), in which the third portion 119 is connected to the first portion 117 along the first direction X to conduct the current I into the third portion 119 of the metal heat slug 116 at least partially along the first direction X (e.g., to the right in FIGS. 1 and 1A). The third portion 119 is connected to the second portion 118 of the metal heat slug 116 along the first direction X to conduct the current I into the second portion 118 of the metal heat slug 116 at least partially along the first direction X (e.g., to the left in FIGS. 1 and 1B). The current I flows through the third portion 119 of the metal heat slug 116 at least partially along the second direction Y, as shown in FIGS. 1 and 1C. The package structure 108 exposes the bottom sides of the respective first and second portions 117 and 118 of the metal heat slug 116 along the first side 101 of the electronic device 100 to conduct the current I into the first portion 117 of the metal heat slug 116 along the third direction Z and to conduct the current I out of the second portion 118 of the metal heat slug 116 along the third direction Z.

In another example, the third portion can be aligned with the first and second portions along the second direction Y, for example, to further reduce the device area and cost and/or to increase spacing between high and low voltage domains of the electronic device for isolation reasons, an example of which is illustrated and described further below in connection with FIGS. 11-11C.

The metal heat slug 116 is or includes a conductive metal, such as copper, aluminum, etc. In one example, the metal heat slug 116 is or includes the same material as that of the lead frames 110, 113 and the leads 111, 112, 114. In another example, the metal heat slug 116 is or includes a different material from that of the lead frames 110, 113 and the leads 111, 112, 114. For example, a copper heat slug 116 can be used with aluminum lead frames 110, 113 and aluminum leads 111, 112, 114. The use of the heat slug for conduction of the sensed current I facilitates adaptation of the electronic device for any desired level of sensed current without significantly increasing the device cost or complexity. For example, the thickness of the metal slug 116 along the third direction Z can be significantly larger than the thickness of the lead frames 110, 113, for example, to facilitate sensing currents or 100 A or more while using leads and lead frames of standard or commonly used thicknesses. The electronic device 100 provides size, cost and complexity benefits over other approaches that use lateral current flow from the thick leads and lead frame structures.

Higher current sensing capability can be accommodated, for example, by increasing the size of a mold cavity used in forming the package structure 108 and increasing thickness of the metal slug 116 along the third direction Z, and extending the leads 111, 112, and 114 further downward to allow soldering to a host circuit board. This allows the use of standard lead frame structures and materials and molding apparatus during fabrication of the electronic device 100, while providing standard device circuit board patterning a spacing to provide current sensing through soldering the exposed bottom sides of the first and second heat slug portions 117 and 118 to the host circuit board. The described examples provide advantages over other approaches that require thicker, non-standard lead frames and/or non-standardized connections to a host circuit board. The described examples facilitate manufacturing integration of the sensed current loop with packaging technologies that use heat slug power pad designs for thermal heat extraction to provide vertical current flow in the heat slug 116 at least partially along the third direction Z during powered operation of the electronic device 100.

In some examples, the lead frames 110 and 113 and the leads 111 and 112 are independent from the high current path P of the sensed current I and these structures do not need to be designed thicker when current capability increases for a given design. Moreover, the lead frames 110 and 113 need only support the heat slug 116 during manufacturing with the package structure 108 providing additional structural support once the electronic device is packaged. When integrated with existing packages using standard lead frame and lead thicknesses and pitch, no special tooling is needed in the assembly factory. In one example, the heat slug 116 can be as thick as half of the package height to conduct high current, or even thicker with further extended up-set lead frame design modifications, such as a heat slug thickness of approximately 0.2 mm to 5.0 mm or more, for example, approximately 0.2 mm to 2.0 mm. The exposed pads or bottom sides of the first and second heat slug portions 117 and 118 input current from the host system and the heat slug 116 provides the sensed current loop in the third portion 119 for current sensing by the semiconductor die 120 mounted on the third portion 119. Further examples can use heat slug structures for sensed current path structures in various packages without tooling up molding, trim/form and other tooling or equipment in a manufacturing facility. The described examples facilitate low cost adaptation and scalability to new designs with a given current rating.

The illustrated examples provide surface mount device (SMD) packages that may be preferred for certain applications, such as automotive customers, and the described examples facilitate small package form factor designs that can be much smaller and more cost effective than other solutions, particularly for high current sensing applications. For example, the electronic device 100 of FIGS. 1-1C has 8 output pins or leads 114 along the fourth side 104 to facilitate flexibility for different bond-out options, and the electronic device can be thinner than other approaches for a given current rating (e.g., a 100 A current sensor electronic device 100 can have an overall package thickness along the third direction Z of approximately 2.5 mm using standard lead frame thicknesses, whereas other solutions can be 7 mm thick or more and use custom lead frames and additional isolation layers.

The described examples also facilitate larger separation between a Hall sensor semiconductor die 120 and the middle of a lead frame trace and thus reduce the magnetic coupling factor and improve the signal to noise ratio (SNR) of the electronic device 100 compared to other solutions that can suffer from poor SNR performance. In one example, the electronic device 100 can include a magnetic flux concentrator (not shown) to improve the magnetic coupling, for example, by a factor of 2 or more and can provide the same or better magnetic coupling of the field created by the sensed current I than is achieved using other costlier approaches such as package-in-package designs with a thick bus bar and magnetic core. In one example, an integrated magnetic concentrator can be included, which is or includes a ferromagnetic alloy, such as a nickel iron alloy (NiFe), a cobalt iron alloy (CoFe), and cobalt or nickel based ternary and quaternary alloys, such as CoFeB, CoNiFe, and CoNiFeCr. In another example (e.g., FIGS. 11-11C below), the heat slug can be modified to provide further spacing advantages for improved SNR performance and/or to allow further reduction in the overall dimensions of the current sensor electronic device.

Figure 2:
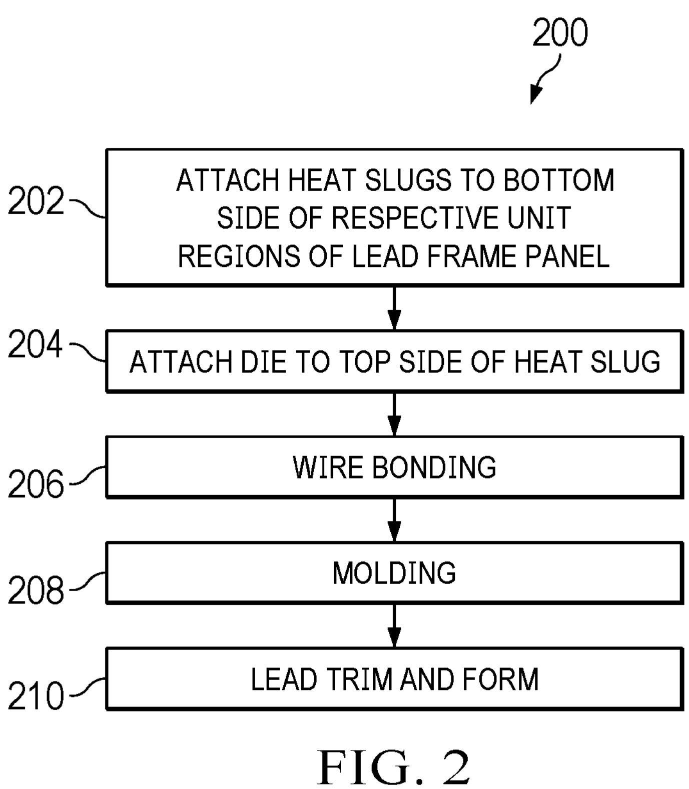
FIG. 2 is a flow diagram of a method of fabricating an electronic device.
Figure 3:
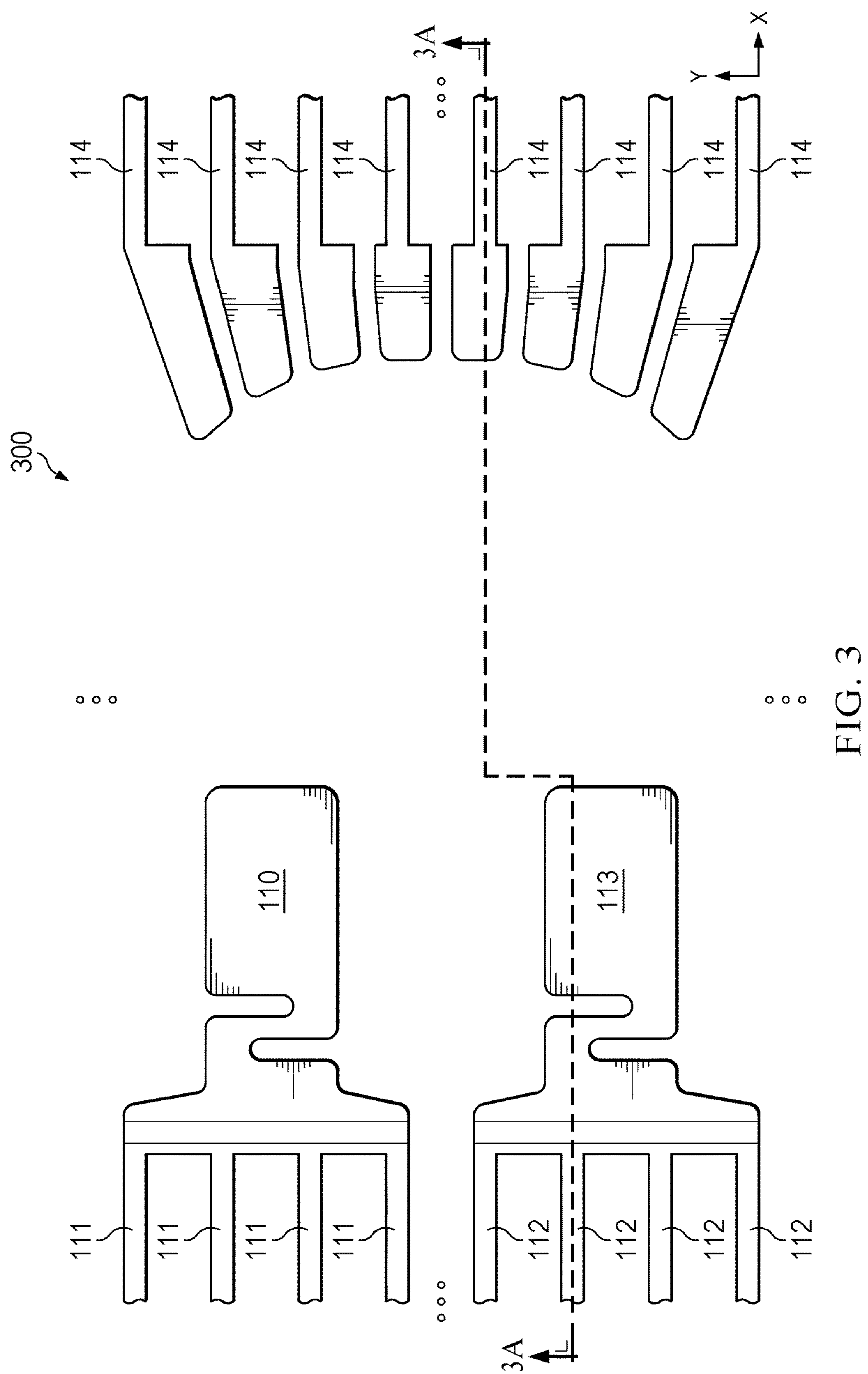
FIG. 3 is a partial top plan view of a lead frame panel.

Referring also to FIGS. 2-9A, FIG. 2 shows an example method 200 of fabricating an electronic device, and FIGS. 3-9A show the electronic device 100 of FIGS. 1-1C undergoing fabrication processing according to the method 200. The method 200 starts with a lead frame, such as a lead frame panel array with rows and columns of prospective device areas. FIGS. 3 and 3A illustrate respective partial top and sectional side views of an example unit region of a starting lead frame panel 300, including unformed leads 111, 112, and 114, as well as the first and second lead frames 110 and 113. In one example, the lead frame panel 300 is or includes aluminum to a standard thickness. In another example, the lead frame panel 300 is or includes copper. The lead frame panel 300 in one example has raised or contoured features, which can be created by etching and/or stamping operations and associated equipment (not shown).

Figure 4:
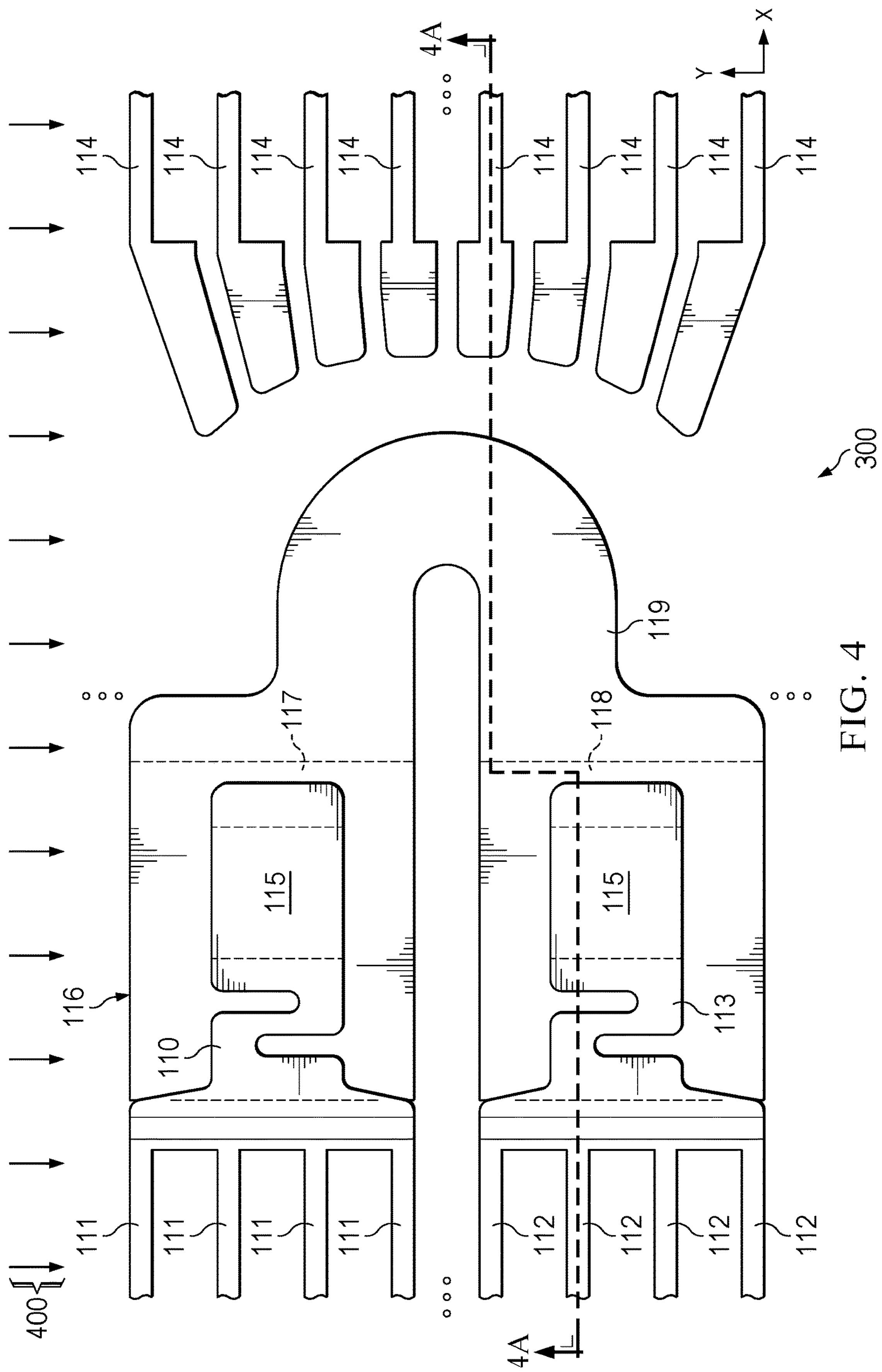
FIG. 4 is a partial top plan view of the lead frame panel undergoing an ultrasonic welding process to attach a heat slug to the lead frame panel.
Figure 4A:
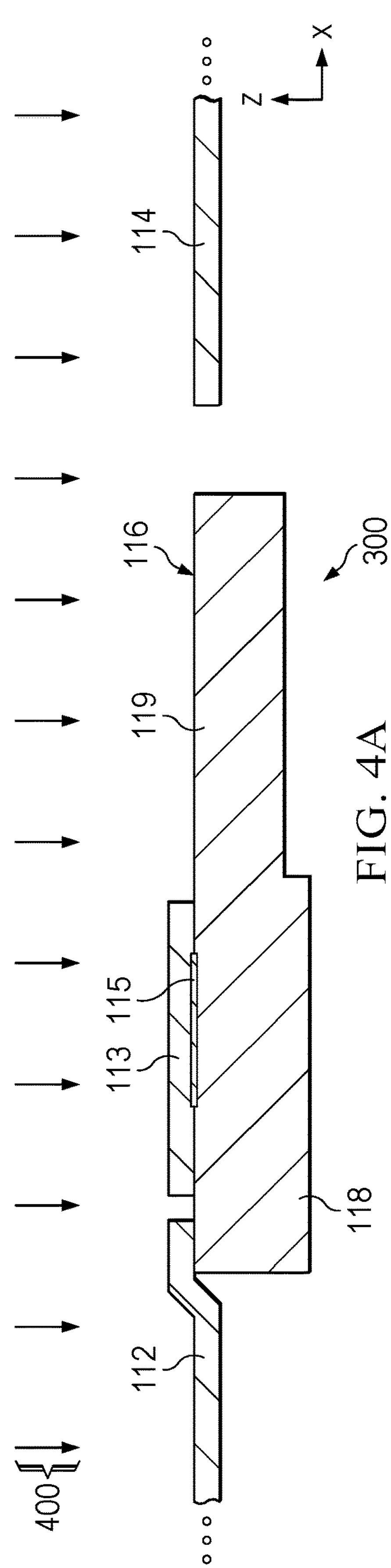
FIG. 4A is a partial sectional side elevation view taken along line 4A-4A of FIG. 4.

The method 200 of FIG. 2 includes heat slug attachment at 202, for example, to attach a heat slug to each unit region of the panel array 300. FIGS. 4 and 4A show respective partial top and sectional side views of the example unit region of the lead frame panel 300 undergoing an attachment process 400 to attach the heat slug 116 to the lead frame panel 300. In the illustrated example, the attachment process 400 attaches the respective first and second portions 117 and 118 of the metal heat slug 116 are attached to the respective first and second lead frames 110 and 113 of each unit area of the panel array 300. In one example, the attachment process 400 is an ultrasonic welding process that welds the respective first and second portions 117 and 118 to the respective first and second lead frames 110 and 113. In another example, the attachment process 400 is a welding process that rivets the first and second portions 117 and 118 of the metal heat slug 116 to the respective first and second lead frames 110 and 113 using rivets (not shown). In another example, the attachment process 400 includes attaching the first and second portions 117 and 118 of the metal heat slug 116 to the respective first and second lead frames 110 and 113 using a non-conductive adhesive (not shown), optionally including a thermal curing step.

Figure 5:
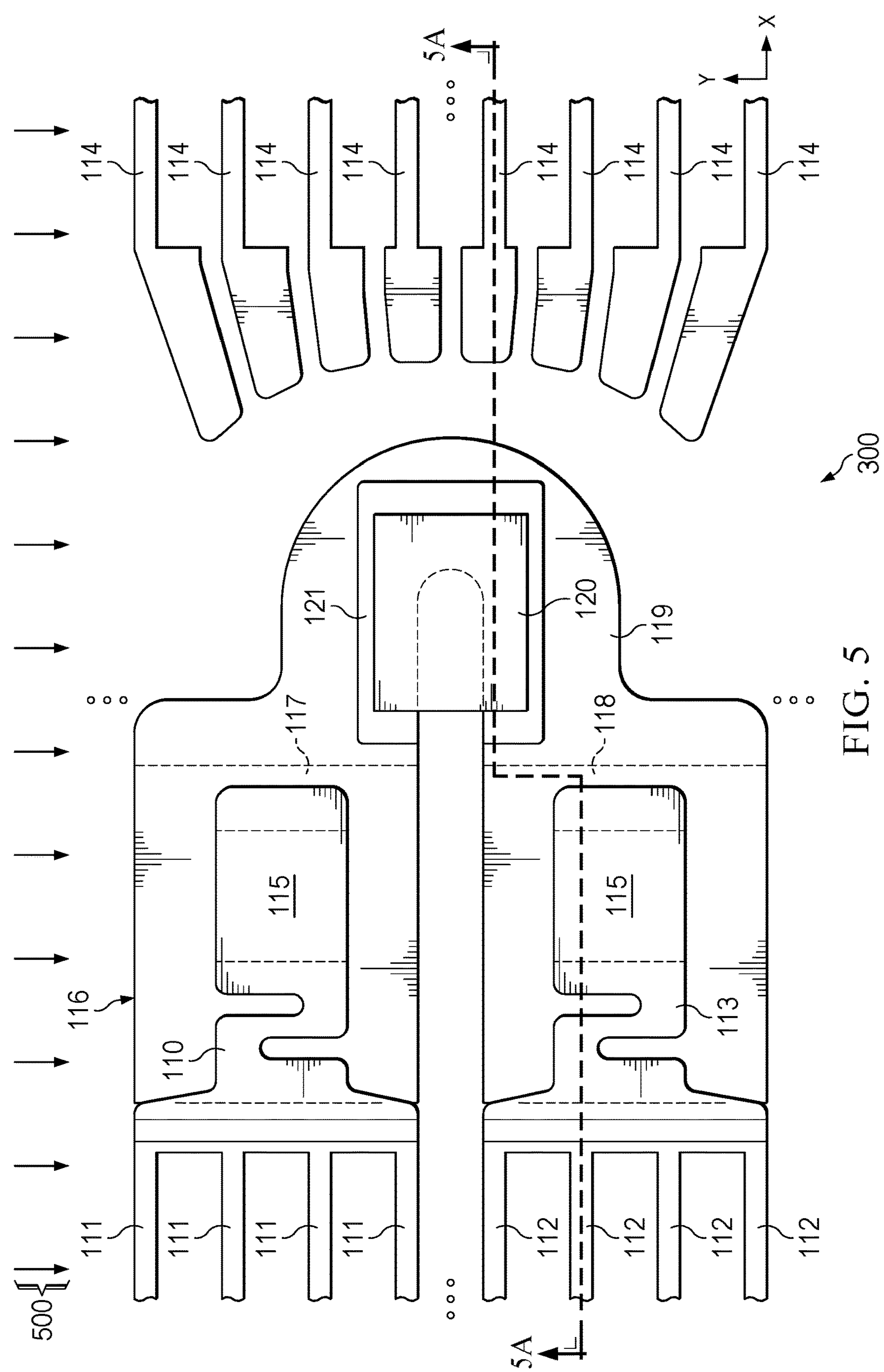
FIG. 5 is a partial top plan view of the lead frame panel undergoing a die attach process to attach a semiconductor die to the heat slug.
Figure 5A:
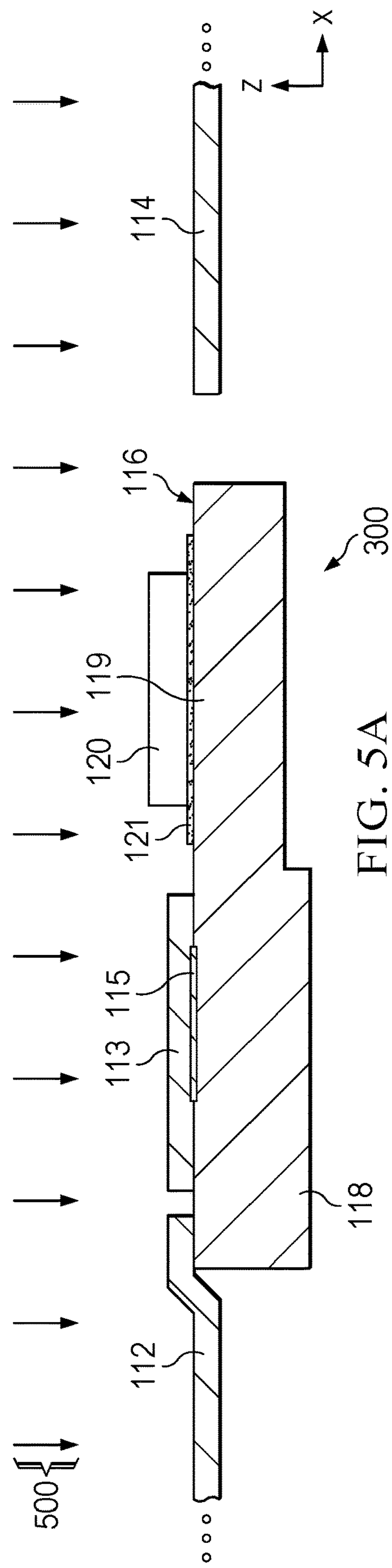
FIG. 5A is a partial sectional side elevation view taken along line 5A-5A of FIG. 5.
Figure 6:
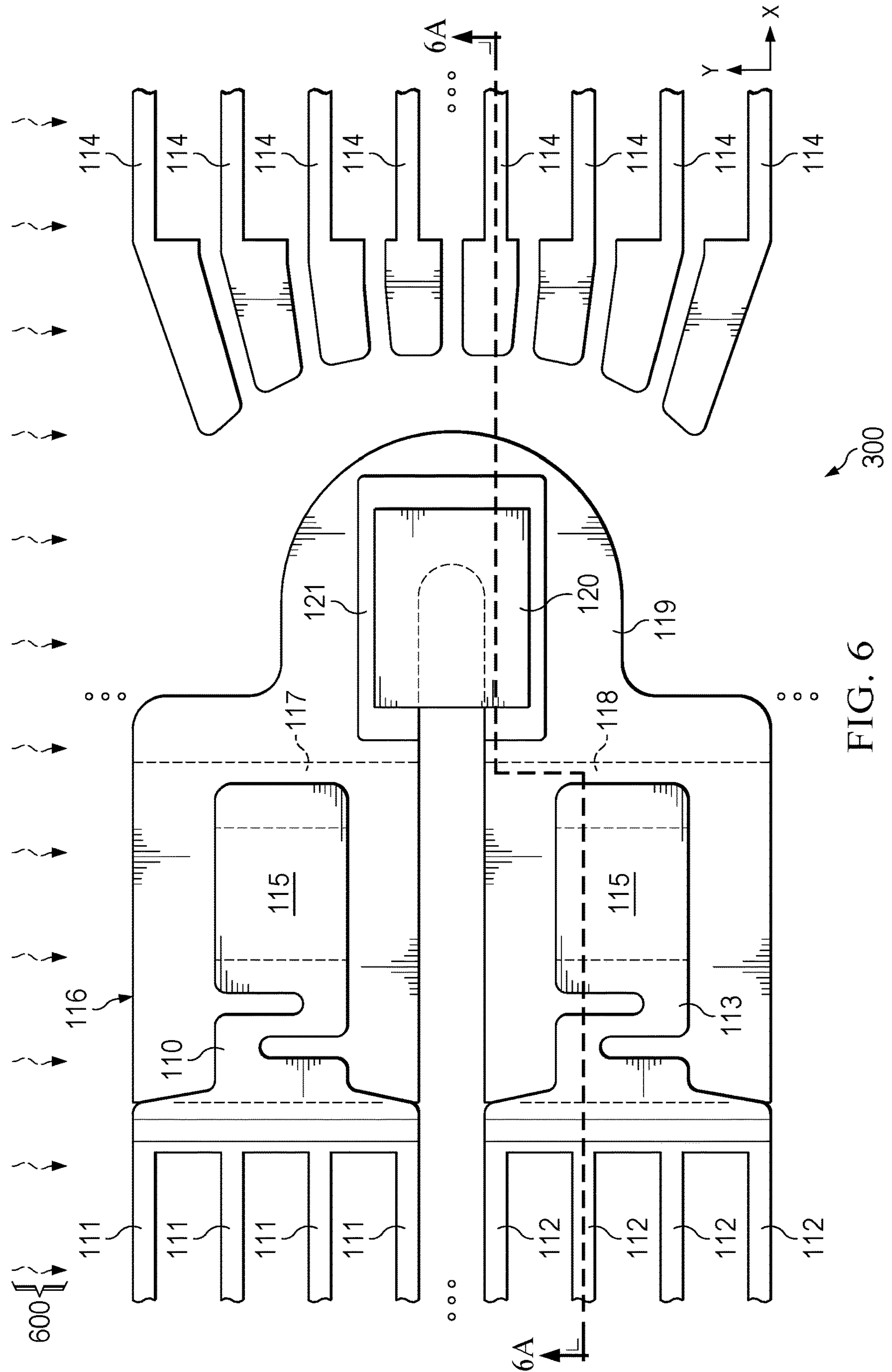
FIG. 6 is a partial top plan view of the lead frame panel undergoing a curing process.
Figure 6A:
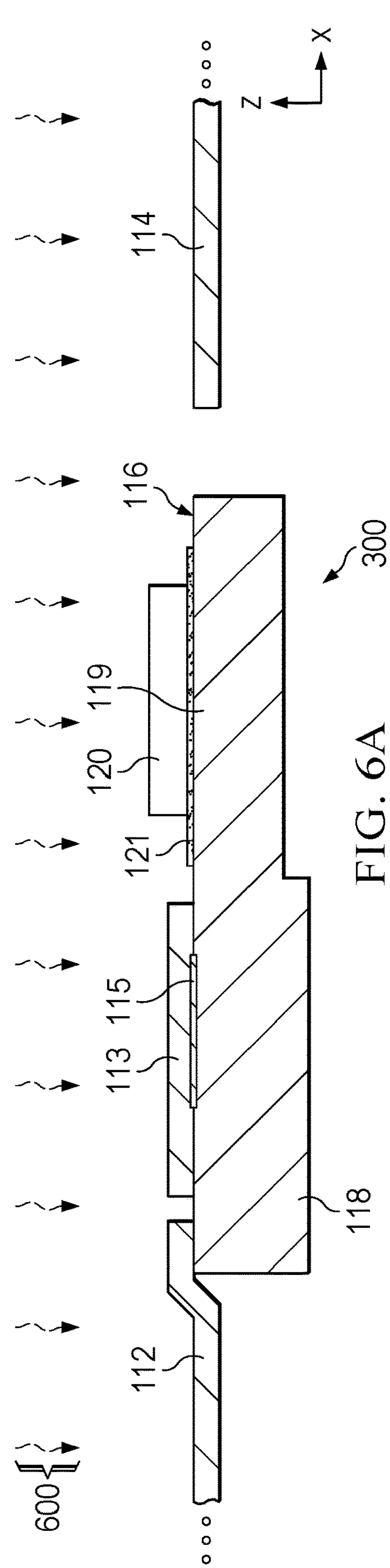
FIG. 6A is a partial sectional side elevation view taken along line 6A-6A of FIG. 6.

The method 200 also includes die attach processing at 204 in FIG. 2. FIGS. 5 and 5A show respective partial top and sectional side views of the example unit region of the lead frame panel 300 undergoing a die attach process 500 to attach the semiconductor die 120 to the heat slug 116. In one example, die attach process 500 includes formation of the die attach adhesive 121 on select areas of the top side of the third portion 119 of the metal heat slug 116, for example, by screening or selective dispensing equipment (not shown), followed by positioning the semiconductor die 120 using automated pick and place equipment (not shown) on the adhesive 121 in each unit region of the lead frame panel array 300. In one example, the die attach process 500 also includes thermal processing to cure the die attach adhesive 121. FIGS. 6 and 6A show respective partial top and sectional side views of the example unit region of the lead frame panel 300 undergoing a thermal curing process 600 that cures the die attach adhesive 121 to finish the attachment of the semiconductor die 120 to the third portion 119 of the metal heat slug 116.

Figure 7:
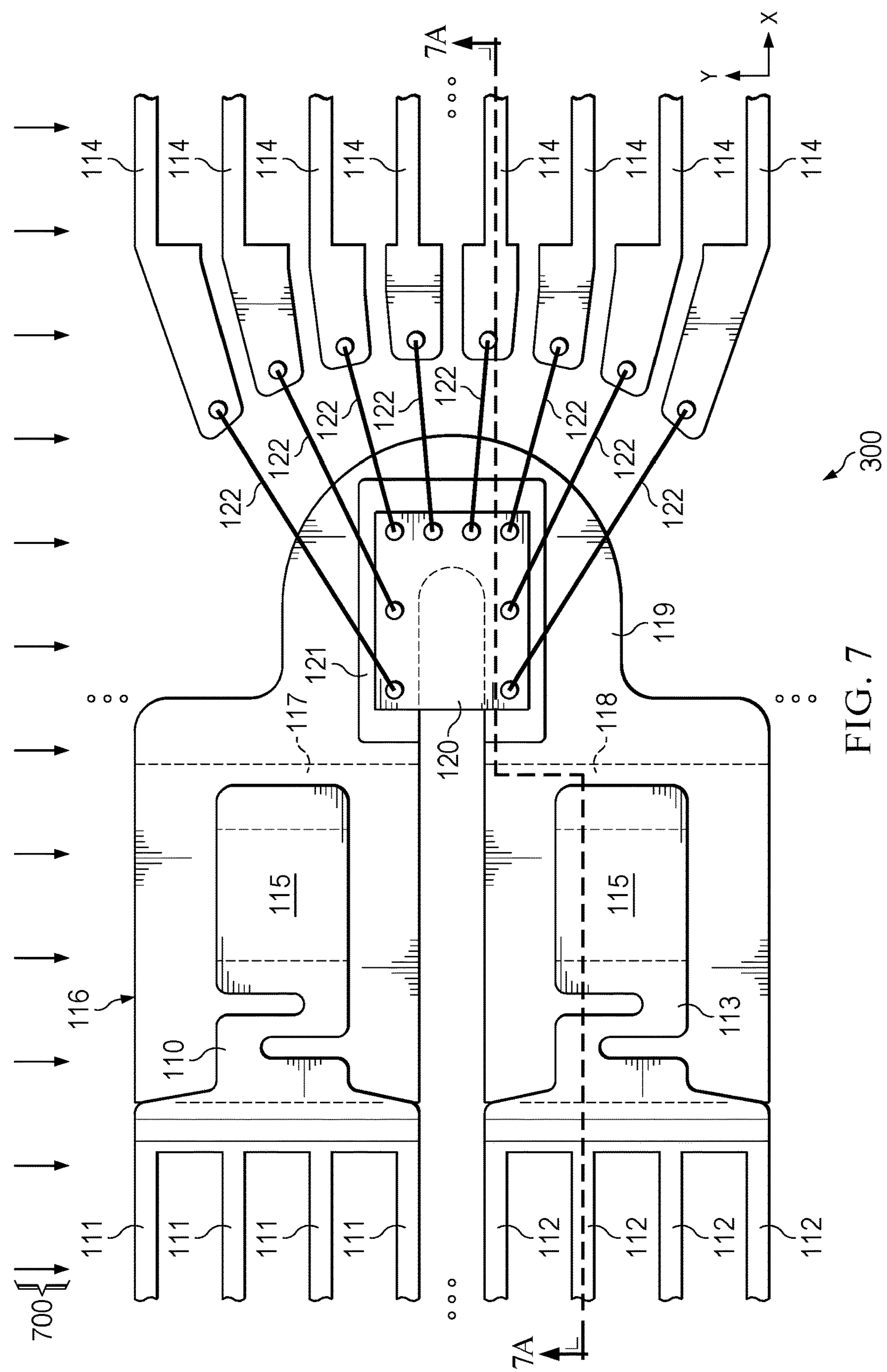
FIG. 7 is a partial top plan view of the lead frame panel undergoing a wire bonding process.
Figure 7A:
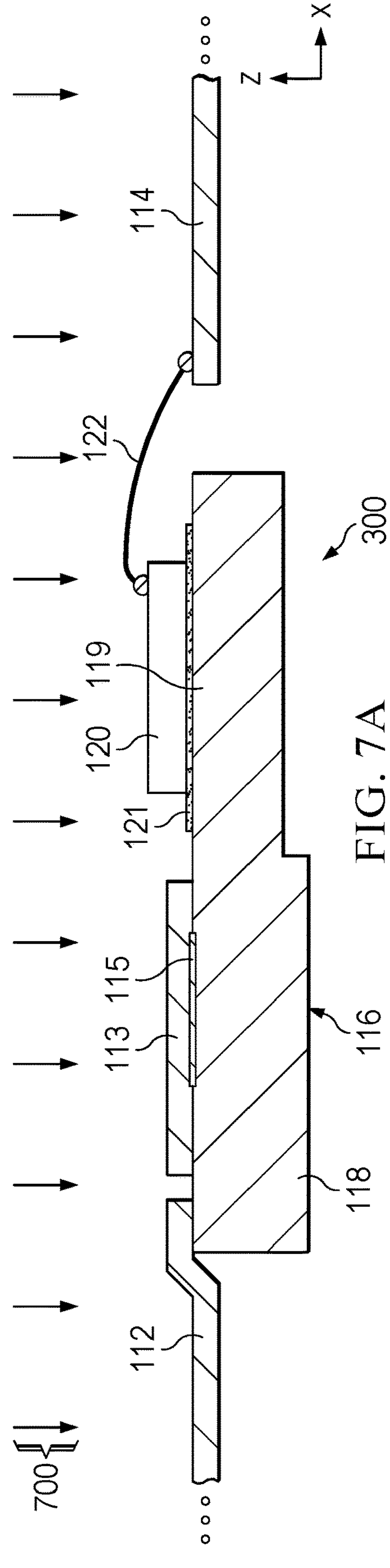
FIG. 7A is a partial sectional side elevation view taken along line 7A-7A of FIG. 7.

At 206 in FIG. 2, the method 200 includes electrical connection processing to electrically connect a circuit of the semiconductor die 120 to one or more device leads, for example, to provide power and signal connections between the Hall-effect current sense circuit of the semiconductor die 120 and an external circuit of a host circuit board (not shown) to which the prospective electronic device 100 can be attached. FIGS. 7 and 7A show respective partial top and sectional side views of the example unit region of the lead frame panel 300 undergoing an electrical connection process 700. In the illustrated example, the electrical connection process 700 is a wire bonding process that electrically connects conductive features of the semiconductor die 120 (e.g., copper or other metal bond pads) to respective ones of the conductive leads 114 by forming the bond wires 122 using automated programmed wire bonding equipment (not shown). In another example, the die attachment at 204 and electrical connection at 206 are implemented by flip chip soldering the conductive features (e.g., copper or other metal pillars) of the semiconductor die 120 to a lead frame or multilayer package substrate (not shown), and the lead frame or other multilayer package substrate includes one or more of the leads 114 and/or bond wires additionally electrically connect traces of the lead frame or multilayer package substrate to respective ones of the conductive leads 114.

Figure 8:
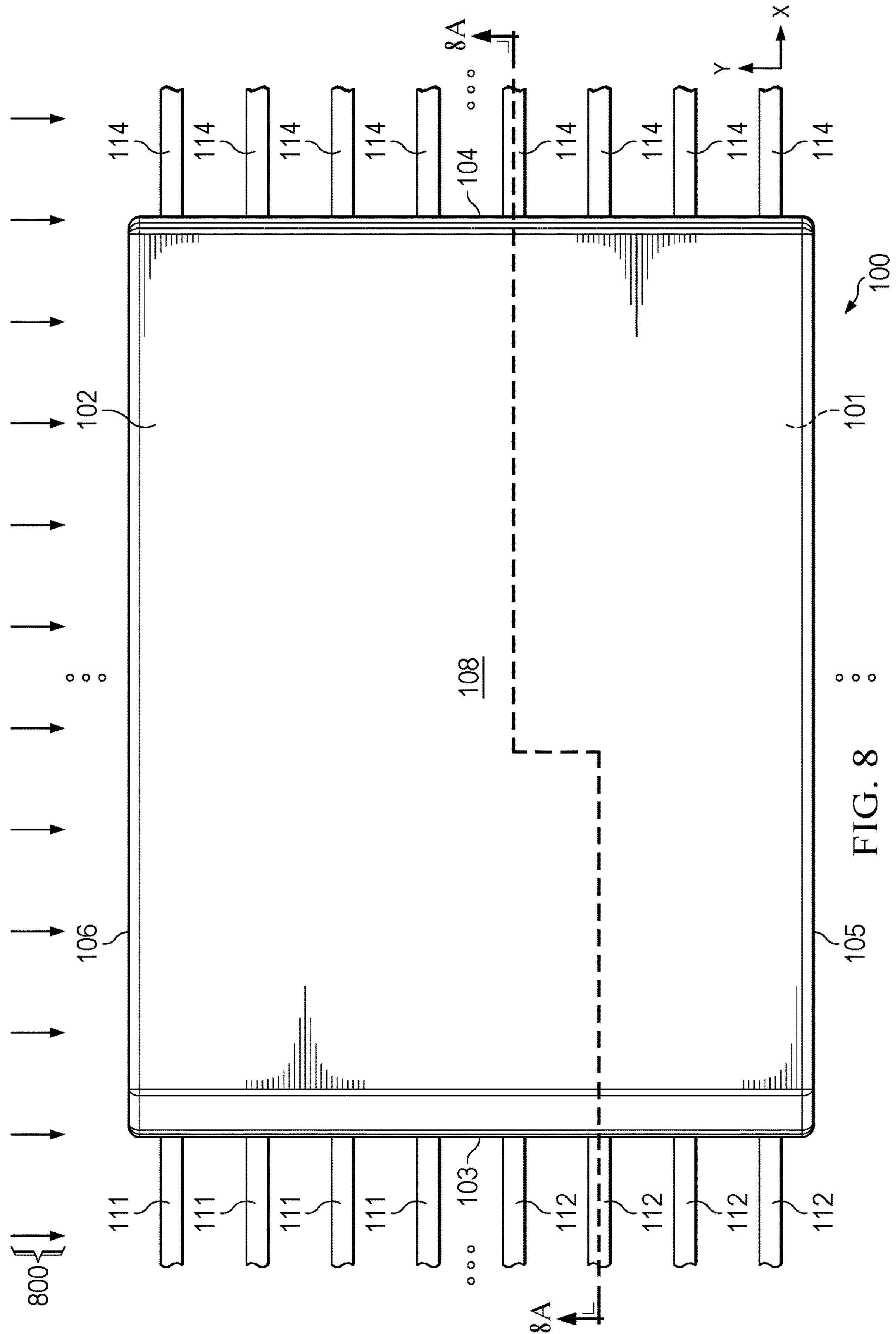
FIG. 8 is a partial top plan view of the lead frame panel undergoing a molding process.
Figure 8A:
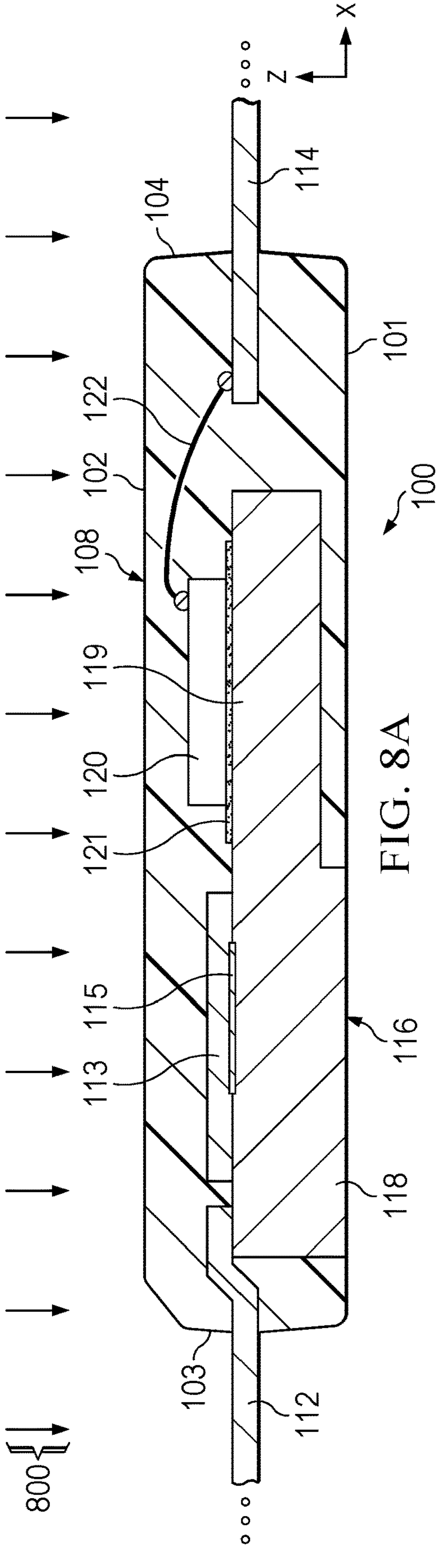
FIG. 8A is a partial sectional side elevation view taken along line 8A-8A of FIG. 8.

The method 200 also includes package structure formation at 208. FIGS. 8 and 8A show respective partial top and sectional side views of the example unit region of the lead frame panel 300 undergoing an example molding process 800 that forms the package structure 108 that encloses the semiconductor die 120 and the third portion 119 of the metal heat slug 116 and exposes sides of the respective first and second portions 117 and 118 of the metal heat slug 116.

Figure 9:
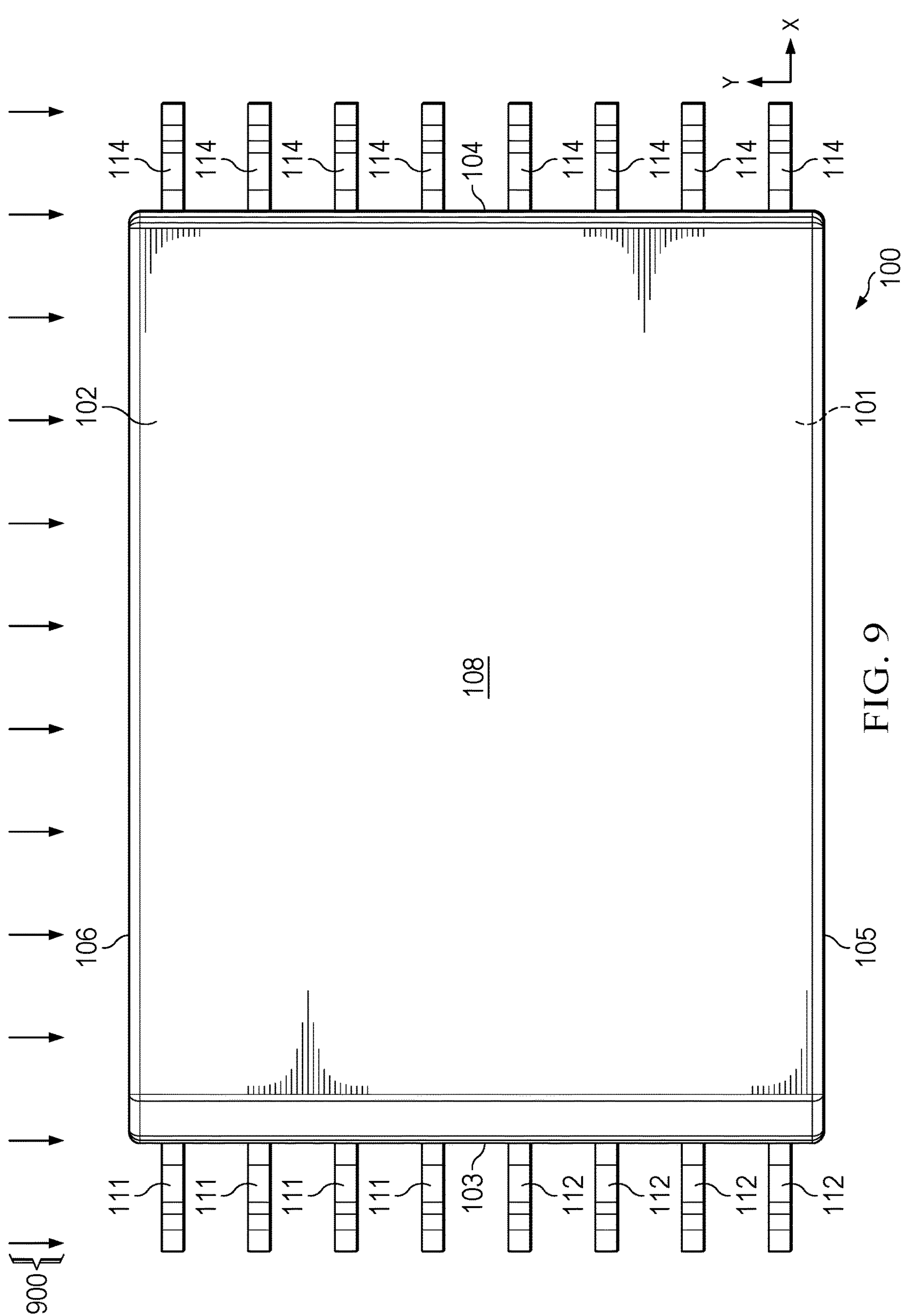
FIG. 9 is a partial top plan view of the lead frame panel undergoing a lead trim and form process to provide a packaged electronic device.
Figures 9A, 10:
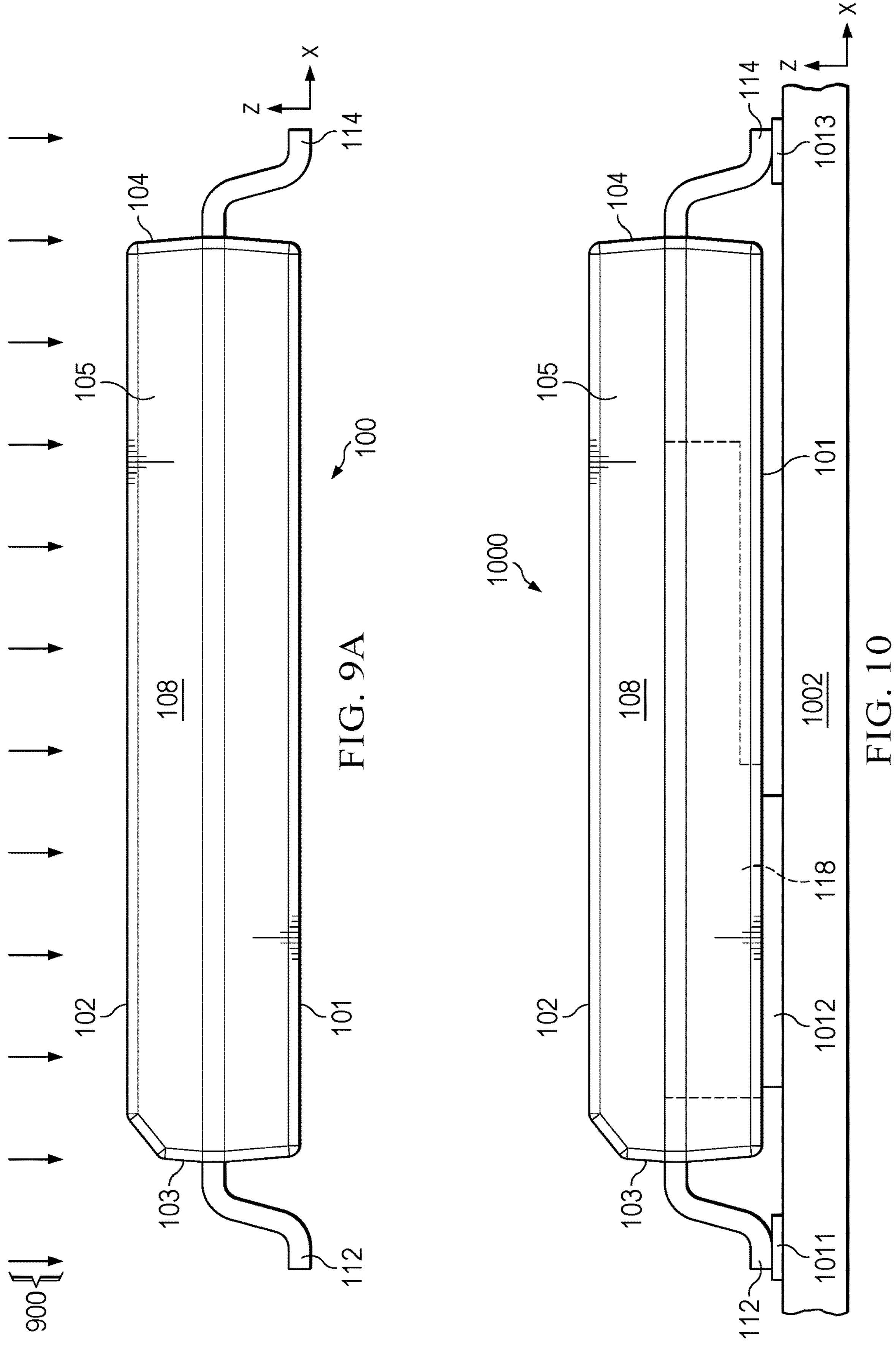
FIG. 9A is a side elevation view of the electronic device of FIG. 9.
FIG. 10 is a side elevation view of a system including the electronic device of FIG. 9 mounted to a printed circuit board.

At 210 in FIG. 2, the method 200 includes lead trimming and forming operations, including package separation processing. FIGS. 9 and 9A show respective top and side views of the example electronic device 100 undergoing a lead trim and form process 900 that includes cutting the leads 111, 112, and 114 between adjacent unit regions of the processed panel array using laser or saw cutting operations and equipment (not shown) and bending or otherwise forming the example gullwing lead shapes (or J-lead shapes or other desired lead shapes) using suitable equipment (not shown).

Referring now to FIGS. 1-1C, 9, 9A, and 10, FIG. 10 shows a side view of a system 1000 including the electronic device 100 of FIGS. 1-1C, 9, and 9A mounted to a printed circuit board 1002. As described above, the electronic device 100 includes the metal heat slug 116 having the first portion 117, the second portion 118, and the third portion 119. The first portion 117 of the metal heat slug 116 is soldered to a first conductive feature of the circuit board 1002 (not shown in the end view of FIG. 10), and the second portion 118 of the metal heat slug 116 is spaced apart from the first portion 117 of the metal heat slug 116 and soldered to a second conductive feature 1012 of the circuit board 1002. The third portion 119 of the metal heat slug 116 connects the first and second portions 117 and 118 of the metal heat slug 116 as shown in FIG. 1. The semiconductor die 120 is attached to the third portion 119 of the metal heat slug 116 and operates to measure the current I of the third portion 119 of the metal heat slug 116. As described above in connection with FIGS. 1-1C, the current I is conducted along the path P from the first circuit board conductive feature through the first, second, and third portions 117-119 of the metal heat slug 116 and out of the electronic device 100 into the second conductive feature 1012 of the circuit board 1002. The semiconductor die 120 senses the amplitude of the magnetic field associated with the sensed current I and provides a suitable output signal to a circuit (not shown) of the host circuit board 1002 via an associated one of the second leads 114. As previously discussed, the current path P of the electronic device 100 shown in FIGS. 1-1C provides vertical sensed current flow upward along the third direction Z into the first portion 117 of the metal heat slug 116, followed by lateral flow along the first direction X into the third portion 119 for sensing the current flowing at least partially along the second direction Y, after which the current path P continues back along the first direction X into the second portion 118 and vertically downward out of the second portion 118 of the metal heat slug 116 along the third direction Z.

Figure 11:
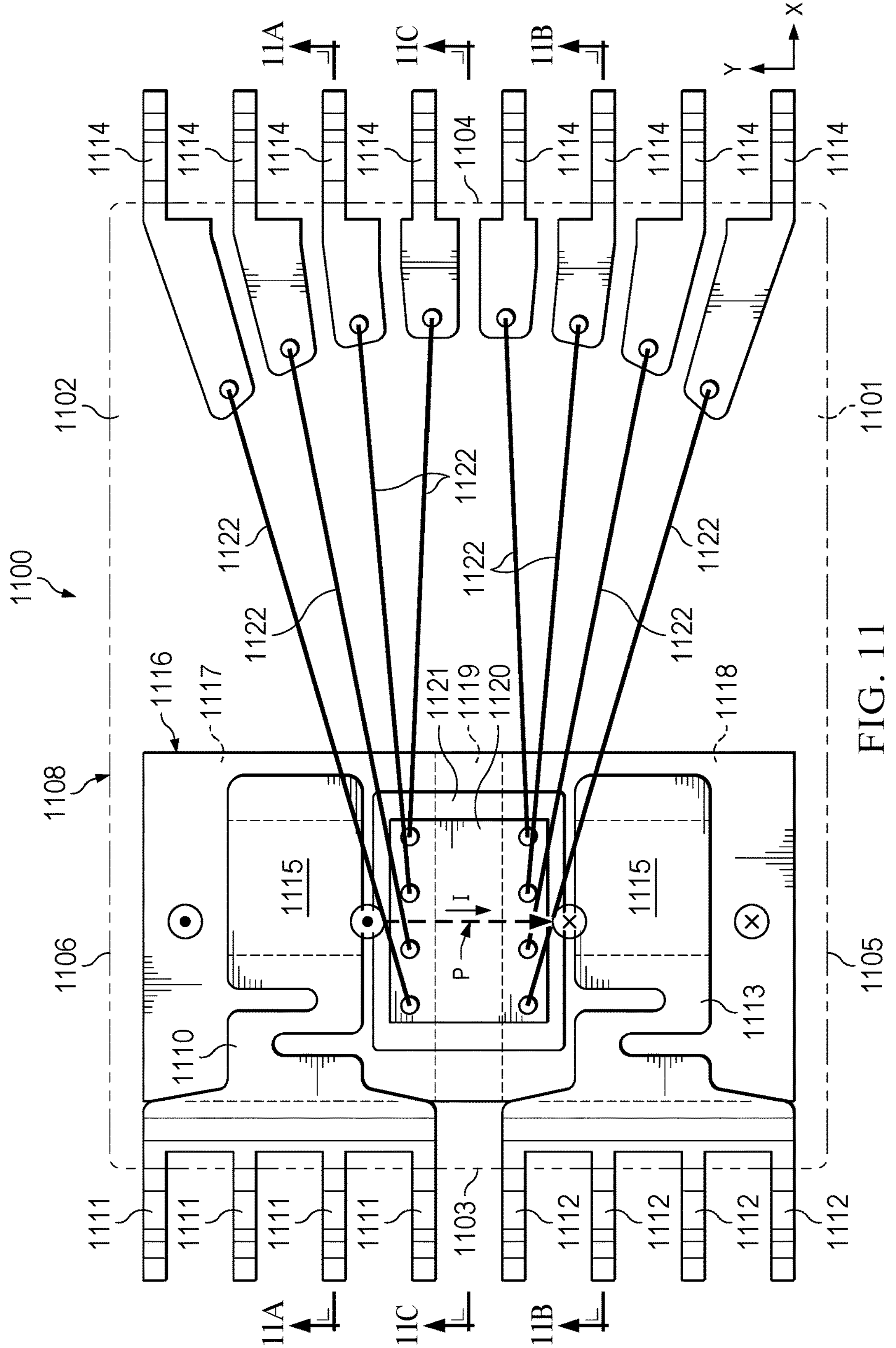
FIG. 11 is a top plan view of another current sensor electronic device.
Figure 11A:
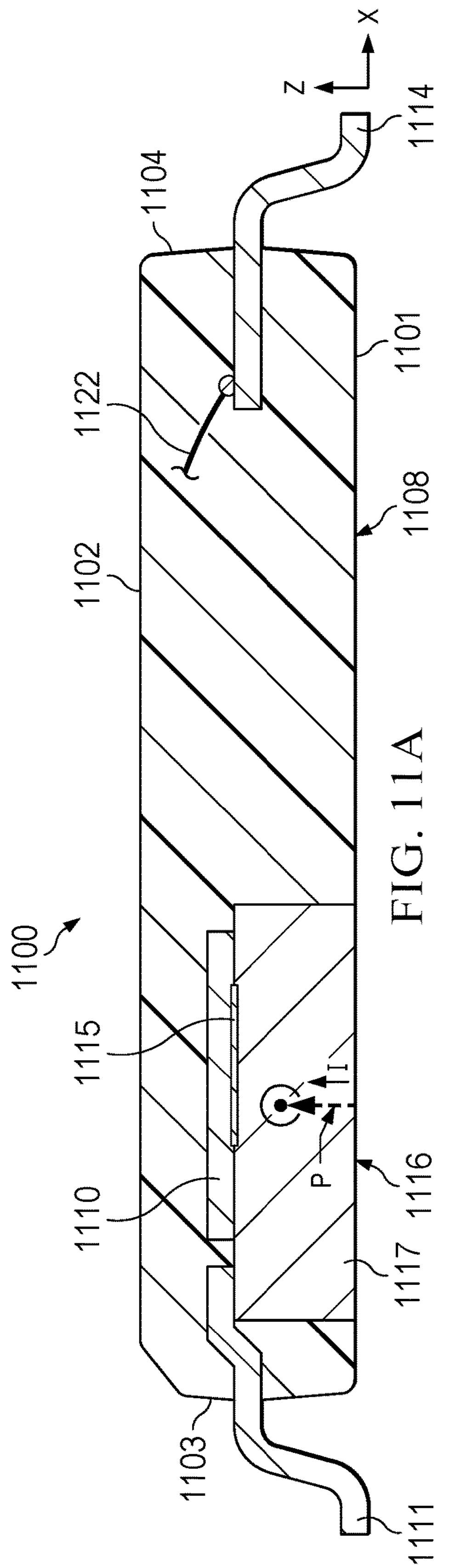
FIG. 11A is a partial sectional side elevation view taken along line 11A-11A of FIG. 11.
Figure 11B:
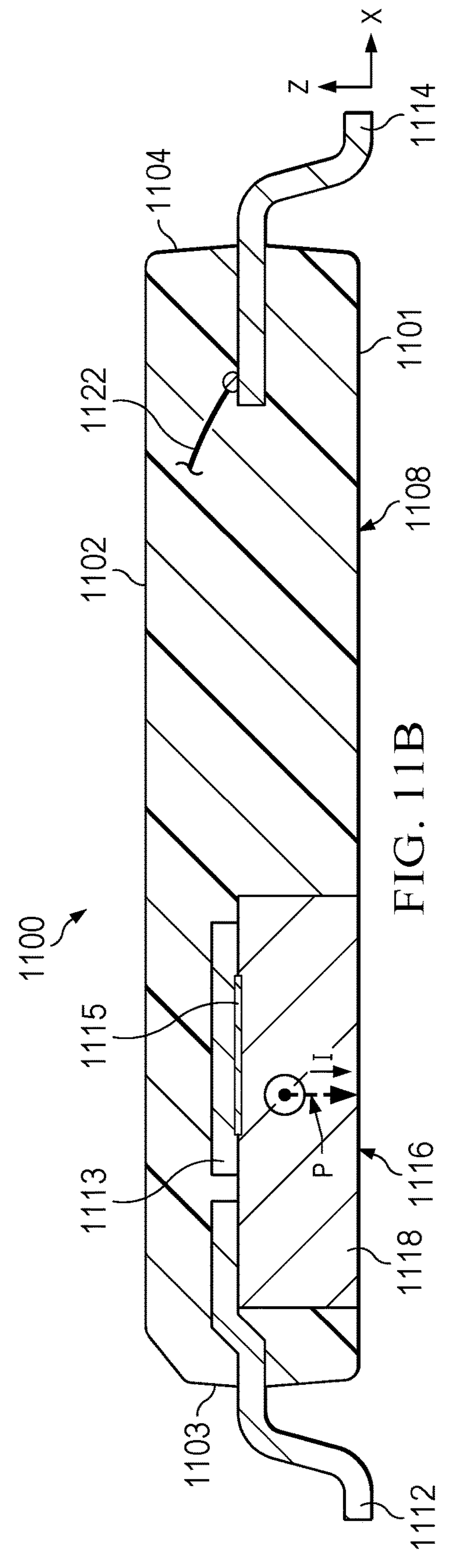
FIG. 11B is a partial sectional side elevation view taken along line 11B-11B of FIG. 11.
Figure 11C:
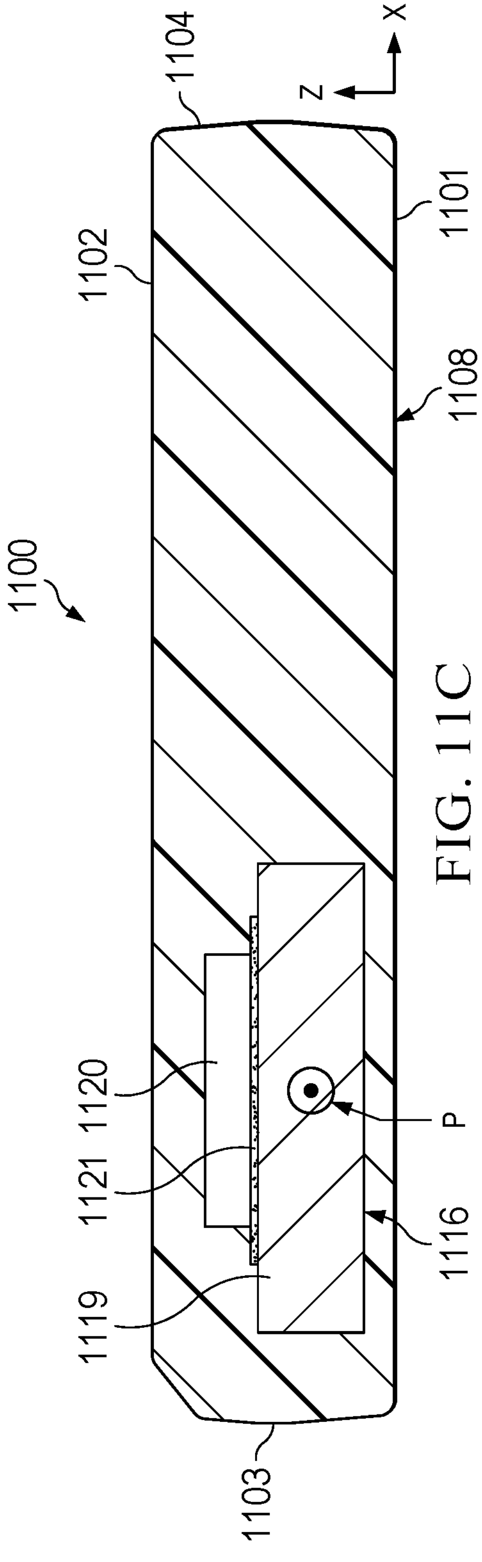
FIG. 11C is a partial sectional side elevation view taken along line 11C-11C of FIG. 11.

FIGS. 11-11C show another example electronic device 1100 in which a metal heat slug is used for conducting sensed current I using a semiconductor die attached to the metal heat slug, with partial vertical flow of the sensed current. In this example, a third portion of the metal heat slug is aligned with the first and second portions along the second direction Y, for example, to further reduce the device area and cost and/or to increase spacing between high and low voltage domains of the electronic device 1100 for isolation benefits. FIG. 11 shows a top view of the current sensor electronic device 1100, FIG. 11A shows a partial sectional side view taken along line 11A-11A of FIG. 11, FIG. 11B shows a partial sectional side view taken along line 11B-11B of FIG. 11, and FIG. 11C shows a partial sectional side view taken along line 11C-11C of FIG. 11. The electronic device 1100 is shown in FIGS. 11-11C in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another.

The electronic device 1100 has a package structure 1108, such as a molded plastic, and the electronic device has opposite first and second (e.g., bottom and top) sides 1101 and 1102, respectively, which are spaced apart from one another along the third direction Z. The package structure 1108 and the electronic device 1100 have laterally opposite third and fourth sides 1103 and 1104 spaced apart from one another along the first direction X, and opposite fifth and sixth sides 1105 and 1106 spaced apart from one another along the second direction Y in the illustrated orientation. The sides 1101-1106 in one example have substantially planar outer surfaces. In other examples, one or more of the sides 1101-1106 have curves, angled features, or other non-planar surface features.

The electronic device 1100 has a first metal lead frame 1110 enclosed by the package structure 1108, as well as a set of first leads 1111 (FIGS. 11 and 11A) that are connected to the lead frame 1110. The first leads 1111 are exposed by the package structure 1108 and extend outward from the third side 1103 of the electronic device 1100 at least partially along the first direction X. A second a set of first leads 1112 (FIGS. 11 and 11B) extend outward from the third side 1103 and are connected to a second metal lead frame 1113 that is enclosed by the package structure 1108. The electronic device 1100 includes a set of second leads 1114 (FIGS. 11, 11A and 11B) that are partially exposed by the package structure 1108. The second leads 1114 extend outward from the fourth side 1104 of the electronic device 1100 at least partially along the first direction X. In the illustrated implementation, one or more of the second leads 1114 provide electrical interconnection between circuitry of the electronic device 1100 and a host circuit board (e.g., FIG. 110 below), and the first leads 1111, 1112 can be soldered to a host circuit board, but need not be electrically connected to circuits of the host circuit board. In another implementation, the first leads 1111, 1112 can be trimmed, such as along the third side 1103 of the package structure 1108 to prevent soldering to a host circuit board. In one example, the lead frames 1110 and 1113 and the leads 1111, 1112 and 1114 are or include a conductive metal, such as aluminum, copper, etc.

As seen in FIGS. 11, 11A and 11B, the electronic device 1100 includes a metal heat slug 1116 with a contiguous electrically conductive metal structure having a first portion 1117, a second portion 1118, and a third portion 1119. Although referred to herein as a heat slug, the slug 1116 provides a conduction path for sensing current and need not perform significant thermal heat transfer during operation of the electronic device 1100. The metal heat slug 1116 is attached to the lead frames 1110 and 1113, for example, by ultrasonic weld joints 1115 in FIGS. 11, 11A, and 11B. The metal heat slug 1116 provides a conduction path P for conducting a current I that flows into the first portion 1117, through the third portion 1119, and out of the second portion 1118. Unlike the device 100 of FIGS. 1-1C above, the path P in the electronic device 1100 does not require current conduction along the first direction X, as shown in FIGS. 11-11C.

The electronic device 1100 also includes a semiconductor die 1120 (FIGS. 11 and 11C) that is attached to the third portion 1119 of the metal heat slug 1116 by an adhesive 1121. The semiconductor die 1120 has a current sensing circuit that is configured to measure the current I of the third portion 1119 of the metal heat slug 1116. In one example, the semiconductor die 1120 includes a Hall-effect sensor circuit that has a sensing direction generally parallel to the second direction Y to sense a magnetic field generated by the current I. In this or another example, the semiconductor die 1120 includes a Hall-effect sensor circuit that has a sensing direction generally parallel to the first direction X to sense the magnetic field generated by the current I. In these or another example, the semiconductor die 1120 includes a Hall-effect sensor circuit that has a sensing direction generally parallel to the third direction Z to sense the magnetic field generated by the current I.

One or more of the second leads 1114 are electrically coupled to respective conductive features (e.g., copper or other metal bond pads) of the semiconductor die 1120 by bond wires 1122 as best shown in FIG. 11. In one example, the leads 1114 and the bond wires 1122 provide power and signal connections between the Hall-effect current sense circuit of the semiconductor die 1120 and an external circuit of a host circuit board (not shown) to which the electronic device 1100 can be attached. The electronic device 1100 provides a small form factor package with standard lead configuration and spacing to facilitate adaptation for installing on a host circuit board (e.g., FIG. 10 above). The illustrated example includes gullwing leads 1111, 1112, and 1114. In another example, leads can have different forms and shapes, such as J-type leads, etc. In a further example, the semiconductor die 1120 is flip chip attached to a lead frame or multilayer package substrate with conductive features (e.g., copper or other metal pillars) of the semiconductor die 1120 soldered to conductive features of the lead frame or multilayer package substrate, and the lead frame or other multilayer package substrate includes one or more of the leads 1111, 1112, and 1114 and/or bond wires electrically connect traces of the lead frame or multilayer package substrate to respective ones of the conductive leads 1114.

The metal heat slug 1116 in one example conducts the current I from the first portion 1117 to the third portion 1119, and the second portion 1118 conducts the current I from the third portion 1119 to a connected host circuit (not shown). In this example, the metal heat slug 1116 has an inverted U-shape when viewed from the third side 1103, in which the second portion 1118 is spaced apart from the first portion 1117 along the second direction Y, the third portion 1119 of the heat slug 1116 is spaced apart from the first side (e.g., bottom) of the electronic device 1100 as shown in FIGS. 11A-11C, and the third portion 1119 connects the first and second portions 1117, 1118.

The package structure 1108 encloses the semiconductor die 1120 and the third portion 1119 of the metal heat slug 1116 and exposes the bottom sides of the first and second portions 1117, 1118 of the metal heat slug 1116. This allows the bottom sides of the first and second portions 1117 and 1118 to be soldered or otherwise electrically connected to respective conductive pads of a host circuit board for conduction of the current I to be sensed by the semiconductor die 1120 in operation of a host system, such as a power system, a motor drive, etc. In one example, the electronic device 1100 is configured to operate with the first leads 1111, 1112 disconnected (e.g., not conducting the sensed current I). In this example, the lead frames 1110 and 1113 and the first leads 1111, 1112 operate as an attachment structure for attaching and supporting the heat slug 1116 during fabrication, such as by ultrasonic welding, riveting, non-conductive adhesives, or other suitable attachment technique, and the lead frames 1110 and 1113 and the first leads 1111, 1112 need not conduct current during powered operation of the electronic device 1100.

The example heat slug 1116 also has a substantially linear shape viewed from above (e.g., as shown in FIG. 11), in which the third portion 1119 is substantially aligned with the first and second portions 1117 and 118 along the second direction Y to conduct the current I into the third portion 1119 of the metal heat slug 1116 at least partially along the second direction Y (e.g., downward in FIG. 11) and to conduct the current I into the second portion 1118 at least partially along the second direction Y. The alignment in this example can be used in various implementations to advantageously reduce the device area and cost and/or to increase spacing between high and low voltage domains of the electronic device for isolation benefits. The package structure 1108 exposes the bottom sides of the respective first and second portions 1117 and 1118 along the first side 1101 of the electronic device 1100 to conduct the current I into the first portion 1117 along the third direction Z and to conduct the current I out of the second portion 1118 along the third direction Z.

The metal heat slug 1116 is or includes a conductive metal, such as copper, aluminum, etc. In one example, the metal heat slug 1116 is or includes the same material as that of the lead frames 1110, 1113 and the leads 1111, 1112, 1114. In another example, the metal heat slug 1116 is or includes a different material from that of the lead frames 1110, 1113 and the leads 1111, 1112, 1114. For example, a copper heat slug 1116 can be used with aluminum lead frames 1110, 1113 and aluminum leads 1111, 1112, 1114. As with the other example described in connection with FIGS. 1-1C above, the use of the metal heat slug 1116 in FIGS. 11-11C for conduction of the sensed current I facilitates adaptation of the electronic device 1100 for any desired level of sensed current without significantly increasing the device cost or complexity. For example, the thickness of the metal slug 1116 along the third direction Z can be significantly larger than the thickness of the lead frames 1110, 1113, for example, to facilitate sensing currents or 100 A or more while using leads and lead frames of standard or commonly used thicknesses. The electronic device 1100 provides size, cost and complexity benefits over other approaches that use lateral current flow from the thick leads and lead frame structures.

Higher current sensing capability can be accommodated, for example, by increasing the size of a mold cavity used in forming the package structure 1108 and increasing thickness of the metal slug 1116 along the third direction Z, and extending the leads 1111, 1112, and 1114 further downward to allow soldering to a host circuit board. This allows the use of standard lead frame structures and materials and molding apparatus during fabrication of the electronic device 1100, while providing standard device circuit board patterning a spacing to provide current sensing through soldering the exposed bottom sides of the first and second heat slug portions 1117 and 1118 to the host circuit board. The described examples provide advantages over other approaches that require thicker, non-standard lead frames and/or non-standardized connections to a host circuit board. The described examples facilitate manufacturing integration of the sensed current loop with packaging technologies that use heat slug power pad designs for thermal heat extraction to provide vertical current flow in the heat slug 1116 at least partially along the third direction Z during powered operation of the electronic device 1100.

In some examples, the lead frames 1110 and 1113 and the leads 1111 and 1112 are independent from the high current path P of the sensed current I and these structures do not need to be designed thicker when current capability increases for a given design. Moreover, the lead frames 1110 and 1113 need only support the heat slug 1116 during manufacturing with the package structure 1108 providing additional structural support once the electronic device is packaged. When integrated with existing packages using standard lead frame and lead thicknesses and pitch, no special tooling is needed in the assembly factory. In one example, the heat slug 1116 can be as thick as half of the package height to conduct high current, or even thicker with further extended up-set lead frame design modifications. The exposed pads or bottom sides of the first and second heat slug portions 1117 and 1118 input current from the host system and the heat slug 1116 provides the sensed current loop in the third portion 1119 for current sensing by the semiconductor die 1120 mounted on the third portion 1119.

Modifications are possible in the described examples, and other implementations are possible, within the scope of the claims.

What is claimed is:

1. An electronic device, comprising:

a metal heat slug having a first portion, a second portion, and a third portion, the second portion spaced apart from the first portion, the third portion connecting the first and second portions;

a semiconductor die attached to the third portion of the metal heat slug and configured to measure a current of the third portion of the metal heat slug; and a package structure that encloses the semiconductor die and the third portion of the metal heat slug and exposes sides of the first and second portions of the metal heat slug at a bottom surface of the package structure.

2. The electronic device of claim 1, further comprising a lead frame attached to the heat slug and enclosed by the package structure.

3. The electronic device of claim 2, further comprising:

a first lead connected to the lead frame and exposed by the package structure, the first lead extending outward from a side of the electronic device; and a second lead electrically coupled to a conductive feature of the semiconductor die and exposed by the package structure, the second lead extending outward from another side of the electronic device.

4. The electronic device of claim 1, wherein:

the third portion of the metal heat slug is connected to the first portion of the metal heat slug along a first direction to conduct the current into the third portion of the metal heat slug at least partially along the first direction;

the third portion of the metal heat slug is connected to the second portion of the metal heat slug along the first direction to conduct the current into the second portion of the metal heat slug at least partially along the first direction; and the second portion is spaced apart from the first portion along a second direction that is orthogonal to the first direction.

5. The electronic device of claim 1, wherein the semiconductor die is attached to the third portion of the metal heat slug by an adhesive that includes layers of a polymer and/or a non-conductive die attach adhesive.

6. The electronic device of claim 1, further comprising a magnetic flux concentrator including a ferromagnetic alloy configured to facilitate magnetic coupling of a field created by the current of the third portion of the metal heat slug.

7. An electronic device, comprising:

a metal heat slug having a first portion, a second portion, and a third portion, the second portion spaced apart from the first portion, the third portion connecting the first and second portions;

a semiconductor die attached to the third portion of the metal heat slug and configured to measure a current of the third portion of the metal heat slug;

a package structure that encloses the semiconductor die and the third portion of the metal heat slug and exposes sides of the first and second portions of the metal heat slug; and, wherein:

the electronic device has opposite first and second sides, opposite third and fourth sides, and opposite fifth and sixth sides;

the third and fourth sides of the electronic device are spaced apart from one another along a first direction;

the fifth and sixth sides of the electronic device are spaced apart from one another along a second direction that is orthogonal to the first direction;

the first and second sides of the electronic device are spaced apart from one another along a third direction that is orthogonal to the first and second directions;

the package structure exposes the sides of the first and second portions of the metal heat slug along the first side of the electronic device to conduct the current into the first portion of the metal heat slug along the third direction and to conduct the current out of the second portion of the metal heat slug along the third direction; and the current flows through the third portion of the metal heat slug at least partially along the second direction.

8. The electronic device of claim 7, further comprising a lead frame attached to the heat slug and enclosed by the package structure.

9. The electronic device of claim 8, further comprising:

a first lead connected to the lead frame and exposed by the package structure, the first lead extending outward from the third side of the electronic device at least partially along the first direction; and a second lead electrically coupled to a conductive feature of the semiconductor die and exposed by the package structure, the second lead extending outward from the fourth side of the electronic device at least partially along the first direction.

10. The electronic device of claim 9, wherein:

the second portion is spaced apart from the first portion along the second direction;

the third portion of the metal heat slug is connected to the first portion of the metal heat slug along the first direction to conduct the current into the third portion of the metal heat slug at least partially along the first direction; and the third portion of the metal heat slug is connected to the second portion of the metal heat slug along the first direction to conduct the current into the second portion of the metal heat slug at least partially along the first direction.

11. The electronic device of claim 7, wherein:

the second portion is spaced apart from the first portion along the second direction;

the third portion of the metal heat slug is connected to the first portion of the metal heat slug along the first direction to conduct the current into the third portion of the metal heat slug at least partially along the first direction; and the third portion of the metal heat slug is connected to the second portion of the metal heat slug along the first direction to conduct the current into the second portion of the metal heat slug at least partially along the first direction.

12. A system, comprising:

a circuit board; and an electronic device, comprising:

a metal heat slug having a first portion, a second portion, and a third portion, the first portion of the metal heat slug soldered to a first conductive feature of the circuit board, the second portion of the metal heat slug spaced apart from the first portion of the metal heat slug and soldered to a second conductive feature of the circuit board, the third portion of the metal heat slug connecting the first and second portions of the metal heat slug, a semiconductor die attached to the third portion of the metal heat slug and configured to measure a current of the third portion of the metal heat slug, and a package structure that encloses the semiconductor die and exposes sides of the first and second portions of the metal heat slug at a bottom surface of the package structure.

13. The system of claim 12, wherein the electronic device further comprises a lead frame attached to the heat slug and enclosed by the package structure.

14. The system of claim 13, wherein the electronic device further comprises:

a first lead connected to the lead frame and exposed by the package structure, the first lead extending outward from a side of the electronic device; and a second lead electrically coupled to a conductive feature of the semiconductor die and exposed by the package structure, the second lead extending outward from another side of the electronic device.

15. The system of claim 12, wherein:

the third portion of the metal heat slug is connected to the first portion of the metal heat slug along a first direction to conduct the current into the third portion of the metal heat slug at least partially along the first direction;

the third portion of the metal heat slug is connected to the second portion of the metal heat slug along the first direction to conduct the current into the second portion of the metal heat slug at least partially along the first direction; and the second portion is spaced apart from the first portion along a second direction that is orthogonal to the first direction.

16. A system, comprising:

a circuit board; and an electronic device, comprising:

a metal heat slug having a first portion, a second portion, and a third portion, the first portion of the metal heat slug soldered to a first conductive feature of the circuit board, the second portion of the metal heat slug spaced apart from the first portion of the metal heat slug and soldered to a second conductive feature of the circuit board, the third portion of the metal heat slug connecting the first and second portions of the metal heat slug, a semiconductor die attached to the third portion of the metal heat slug and configured to measure a current of the third portion of the metal heat slug, a package structure that encloses the semiconductor die and exposes sides of the first and second portions of the metal heat slug, wherein:

the electronic device has opposite first and second sides, opposite third and fourth sides, and opposite fifth and sixth sides;

the third and fourth sides of the electronic device are spaced apart from one another along a first direction;

the fifth and sixth sides of the electronic device are spaced apart from one another along a second direction that is orthogonal to the first direction;

the first and second sides of the electronic device are spaced apart from one another along a third direction that is orthogonal to the first and second directions;

the package structure exposes the sides of the first and second portions of the metal heat slug along the first side of the electronic device to conduct the current into the first portion of the metal heat slug along the third direction and to conduct the current out of the second portion of the metal heat slug along the third direction; and the current flows through the third portion of the metal heat slug at least partially along the second direction.

17. An electronic device, comprising a metal heat slug having a first portion, a second portion, and a third portion, the second portion spaced apart from the first portion, the third portion connecting the first and second portions;

a lead frame attached to the heat slug;

a semiconductor die attached to the third portion of the metal heat slug and configured to measure a current of the third portion of the metal heat slug; and a package structure that encloses the semiconductor die, the third portion of the metal heat slug and exposes sides of the first and second portions of the metal heat slug.

18. The electronic device of claim 17, further comprising:

a first lead connected to the lead frame and exposed by the package structure, the first lead extending outward from a side of the electronic device; and a second lead electrically coupled to a conductive feature of the semiconductor die and exposed by the package structure, the second lead extending outward from another side of the electronic device.

19. The electronic device of claim 17, wherein the heat slug is attached to the lead frame by at least one of ultrasonic welding, riveting, non-conductive adhesive.

20. The electronic device of claim 17, wherein the metal heat slug is or includes a different material from that of the lead frame.

21. The electronic device of claim 17, wherein a thickness of at least a portion of the metal slug is larger than a thickness of the lead frame.

22. A system, comprising:

a circuit board; and an electronic device, comprising:

a metal heat slug having a first portion, a second portion, and a third portion, the first portion of the metal heat slug soldered to a first conductive feature of the circuit board, the second portion of the metal heat slug spaced apart from the first portion of the metal heat slug and soldered to a second conductive feature of the circuit board, the third portion of the metal heat slug connecting the first and second portions of the metal heat slug, a lead frame attached to the heat slug;

a semiconductor die attached to the third portion of the metal heat slug and configured to measure a current of the third portion of the metal heat slug, and a package structure that encloses the semiconductor die and exposes sides of the first and second portions of the metal heat slug.

23. The system of claim 22, further comprising:

a first lead connected to the lead frame and exposed by the package structure, the first lead extending outward from a side of the electronic device; and a second lead electrically coupled to a conductive feature of the semiconductor die and exposed by the package structure, the second lead extending outward from another side of the electronic device.

24. The system of claim 22, wherein the heat slug is attached to the lead frame by at least one of ultrasonic welding, riveting, non-conductive adhesive.

25. The system of claim 22, wherein the metal heat slug is or includes a different material from that of the lead frame.

26. The system of claim 22, wherein a thickness of at least a portion of the metal slug is larger than a thickness of the lead frame.

* * * * *